(12) United States Patent
Teraguchi et al.

(10) Patent No.: US 9,564,482 B2
(45) Date of Patent: Feb. 7, 2017

(54) DISPLAY DEVICE AND ELECTRONIC APPARATUS

(71) Applicant: JOLED Inc., Tokyo (JP)

(72) Inventors: Shinichi Teraguchi, Kanagawa (JP); Eisuke Negishi, Tokyo (JP); Mikihiro Yokozeki, Kanagawa (JP); Shuji Kudo, Kanagawa (JP)

(73) Assignee: JOLED Inc., Tokyo (JP)

( * ) Notice: Subject to any disclaimer, the term of this patent is extended or adjusted under 35 U.S.C. 154(b) by 127 days.

(21) Appl. No.: 14/662,449

(22) Filed: Mar. 19, 2015

(65) Prior Publication Data

US 2015/0279918 A1    Oct. 1, 2015

(30) Foreign Application Priority Data

Mar. 31, 2014   (JP) ................. 2014-071920

(51) Int. Cl.
*H01L 27/32*    (2006.01)

(52) U.S. Cl.
CPC ....... *H01L 27/3276* (2013.01); *H01L 27/3248* (2013.01)

(58) Field of Classification Search
CPC .. H01L 27/32; H01L 27/3272; H01L 27/3276; H01L 51/52; H01L 51/50; H01L 51/5275; H01L 51/5012; H01L 27/3246; H01L 51/5284

See application file for complete search history.

(56) References Cited

U.S. PATENT DOCUMENTS

| 2003/0231263 | A1* | 12/2003 | Kato | G02F 1/13454 349/56 |
| 2004/0140547 | A1* | 7/2004 | Yamazaki | H01L 21/6835 257/686 |
| 2006/0231842 | A1* | 10/2006 | Hirakata | H01L 25/048 257/72 |
| 2007/0109735 | A1* | 5/2007 | Yamazaki | G02F 1/13452 361/679.01 |
| 2014/0346485 | A1* | 11/2014 | Noda | H01L 51/5275 257/40 |

FOREIGN PATENT DOCUMENTS

JP        2012-128006 A      7/2012

* cited by examiner

*Primary Examiner* — Selim Ahmed
(74) *Attorney, Agent, or Firm* — Michael Best & Friedrich LLP

(57) ABSTRACT

A display device includes a pixel section that includes a plurality of pixels each of which has a display element and which are disposed in a two-dimensional manner, and a driving circuit section that drives the plurality of pixels in order to perform display, in which a first floor including the driving circuit section and a second floor including the pixel section are laminated.

20 Claims, 28 Drawing Sheets

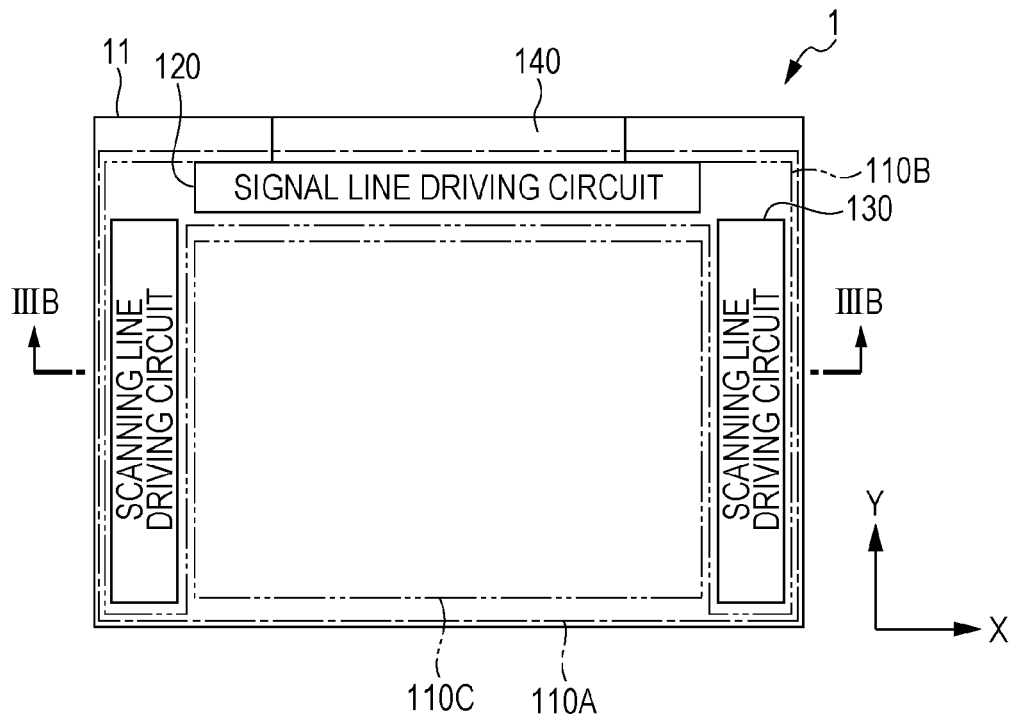
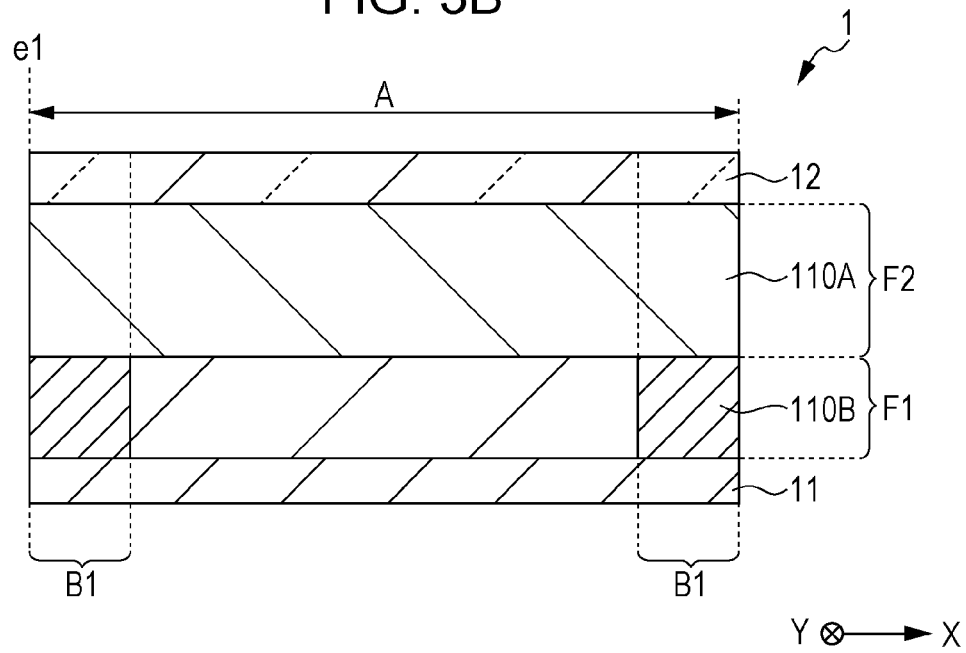

DISPLAY DEVICE AND ELECTRONIC APPARATUS

CROSS REFERENCE TO RELATED APPLICATIONS

This application claims the benefit of Japanese Priority Patent Application JP 2014-071920 filed Mar. 31, 2014, the entire contents of which are incorporated herein by reference.

BACKGROUND

The present disclosure relates to a display device including, for example, an organic electro luminescent (EL) element, and an electronic apparatus using the display device.

In recent years, narrowing of a frame has progressed in a display device including a mobile use. However, in a small or medium-sized display device, there is a restriction in a layout of peripheral driving circuits, and thus it is difficult to realize a narrow frame. Therefore, a method has been proposed in which a frame portion is bent by using a stainless steel substrate or a plastic substrate (Japanese Unexamined Patent Application Publication No. 2012-128006).

SUMMARY

However, in the method disclosed in Japanese Unexamined Patent Application Publication No. 2012-128006, there is a case where the frame portion may not be bent depending on a substrate material or thickness, or a layout of the driving circuits. Therefore, it is desirable to realize a narrow frame (or a non-frame) by using a method different from such a method.

It is desirable to provide a display device and an electronic apparatus capable of realizing a narrow frame or a non-frame.

A display device according to an embodiment of the present disclosure includes a pixel section that includes a plurality of pixels each of which has a display element and which are disposed in a two-dimensional manner, and a driving circuit section that drives the plurality of pixels in order to perform display, in which a first floor including the driving circuit section and a second floor including the pixel section are laminated.

An electronic apparatus according to another embodiment of the present disclosure includes the display device of the present disclosure.

In the display device and the electronic apparatus according to the embodiments of the present disclosure, the display device includes a pixel section that includes a plurality of pixels each of which has a display element and which are disposed in a two-dimensional manner, and a driving circuit section that drives the plurality of pixels in order to perform display, in which a first floor including the driving circuit section and a second floor including the pixel section are laminated. Therefore, a space for disposing the driving circuit section is reduced in a peripheral region of the pixel section.

According to the display device and the electronic apparatus of the embodiments of the present disclosure, the display device includes a pixel section that includes a plurality of pixels each of which has a display element and which are disposed in a two-dimensional manner, and a driving circuit section that drives the plurality of pixels in order to perform display, in which a first floor including the driving circuit section and a second floor including the pixel section are laminated. Consequently, a space for disposing the driving circuit section is reduced in a peripheral region of the pixel section. Therefore, it is possible to realize a narrow frame or a non-frame.

The above-described content is an example of the present disclosure. An effect of the present disclosure is not limited thereto, and another effect may be achieved, and still another effect may be included therein.

BRIEF DESCRIPTION OF THE DRAWINGS

FIG. 3A is a schematic plan view illustrating a layout of a pixel section and a circuit section illustrated in FIG. 1;

FIG. 3B is a schematic cross-sectional view illustrating a layout of a pixel section and a circuit section illustrated in FIG. 1;

DETAILED DESCRIPTION OF EMBODIMENTS

Hereinafter, embodiments of the present disclosure will be described later in detail in the following order with reference to the drawings.

1. First Embodiment (an example of a display device in which a circuit section is provided to be laminated on a pixel section in a region corresponding to three sides of a panel)

2. Modification Example 1 (an example in which constituent elements of the circuit section are provided in a distribution manner)

3. Modification Example 2 (an example in which a scanning line driving circuit is provided to be integrated in one side of the panel)

4. Second Embodiment (an example of a display device used in a transparent display)

5. Modification Example 3 (an example of another emission type (bottom emission) display device)

6. Third Embodiment (an example in which a write transistor is provided in the same floor as that of a circuit section)

7. Modification Example 4 (an example in which a connection layer of a first electrode and a driving transistor is omitted)

8. Modification Example 5 (a preferred example of end surface sealing)

9. Application Examples (examples of electronic apparatuses)

First Embodiment

Configuration

Figure 1:
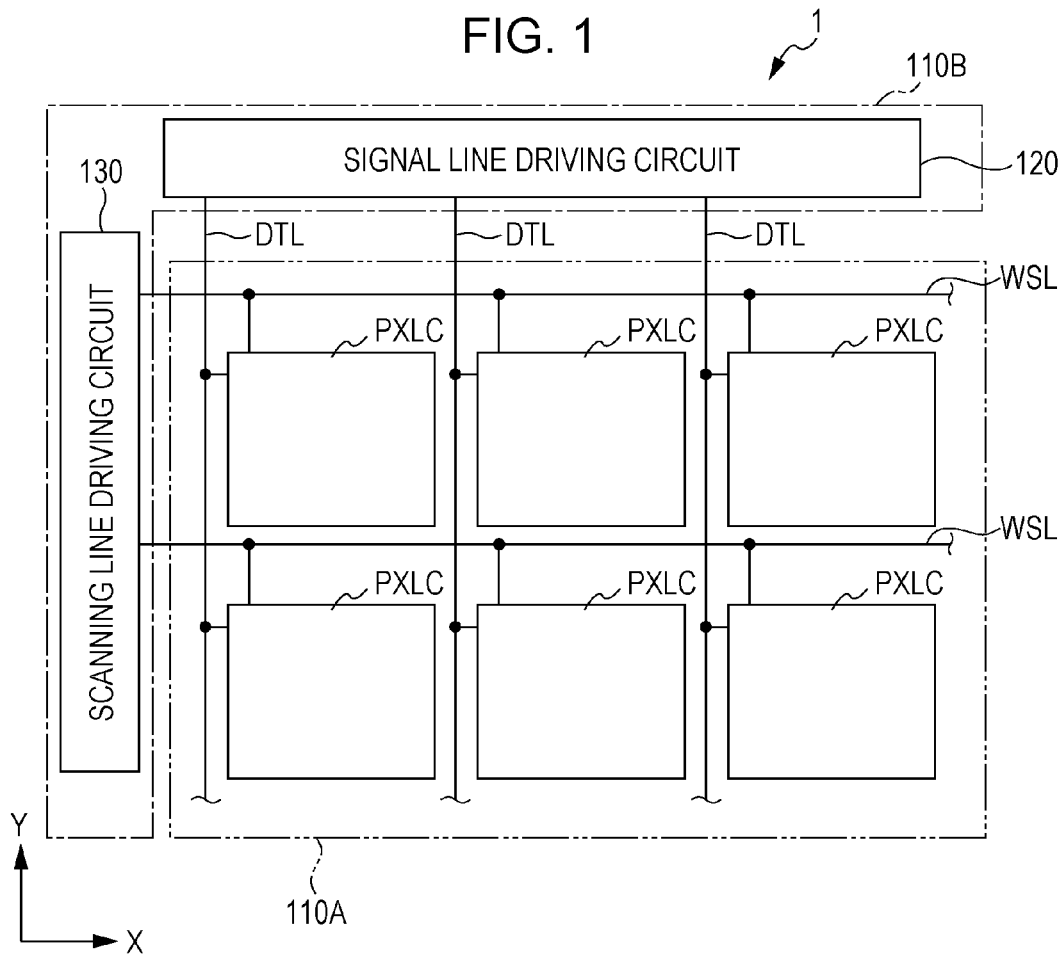
FIG. 1 is a functional block diagram illustrating the entire configuration of a display device according to a first embodiment of the present disclosure.

FIG. 1 illustrates the entire configuration of a display device (display device 1) according to a first embodiment of the present disclosure. The display device 1 is used as an organic EL display or the like. The display device 1 is provided with, for example, a pixel section (pixel section 110A) which includes a plurality of pixels PXLC disposed in a matrix in a two-dimensional manner, and a driving circuit section (circuit section 110B) which drives the pixel section 110A so as to perform display. The pixel PXLC corresponds to one of subpixels of four colors including, for example, red (R), green (G), blue (B), and white (W), and a set of four-color pixels PXLC forms a single pixel, and an image is displayed.

Each of the pixels PXLC is a pixel (or a pixel circuit) including, for example, a display element (for example, an organic EL element 10 which will be described later), a pixel transistor, and a capacitive element. The pixels PXLC are arranged in two directions including an X direction (for example, a horizontal direction of a display screen) and a Y direction (for example, a vertical direction of the display screen) which are perpendicular to each other. The circuit section 110B includes, for example, a signal line driving circuit 120 and a scanning line driving circuit 130 which are drivers for displaying an image. Although not illustrated, the circuit section 110B may include other circuit elements such as a power line driving circuit.

Figure 2:
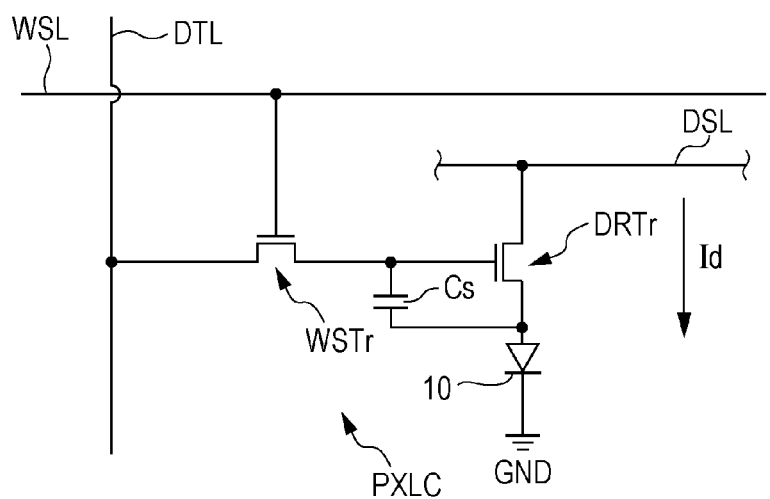
FIG. 2 is a circuit diagram illustrating an example of a pixel circuit of a pixel illustrated in FIG. 1.

FIG. 2 illustrates a circuit configuration of the pixel PXLC. The pixel PXLC is, for example, an active type pixel circuit, and includes, for example, a driving transistor DRTr, a write transistor WSTr, a capacitor (storage capacitor) Cs, and the organic EL element 10. The organic EL element 10 is connected in series to the driving transistor DRTr between a first power supply line DSL (Vcc) and a second power supply line (GND). The driving transistor DRTr and the write transistor WSTr are general thin film transistors (TFTs), and have an inverse stagger structure (so-called bottom gate type) or a stagger structure (top gate type). Configurations of the driving transistor DRTr and the write transistor WSTr will be described later.

In the display device 1, a plurality of signal lines DTL are disposed in a column direction, and a plurality of scanning lines WSL are disposed in a row direction. An intersection between each of the signal lines DTL and each of the scanning lines WSL corresponds to the pixel PXLC. Each of the signal lines DTL is connected to the signal line driving circuit 120, and a video signal is supplied to a source electrode of the write transistor WSTr from the signal line driving circuit 120 via the signal line DTL. Each of the scanning lines WSL is connected to the scanning line driving circuit 130, and a scanning signal is supplied to a gate electrode of the write transistor WSTr from the scanning line driving circuit 130 via the scanning line WSL.

FIGS. 3A and 3B are schematic diagrams for explaining a layout of the pixel section 110A and the circuit section 110B, in which FIG. 3A illustrates an XY planar configuration, and FIG. 3B illustrates a cross-sectional configuration. In addition, FIG. 3B is a cross-sectional view taken along the line IIIB-IIIB of FIG. 3A.

The pixel section 110A is formed over substantially the entire surface of a substrate 11. In other words, in the display device 1, substantially the entire region of one surface of the display panel is an active display region, and thus light can also be emitted from the vicinity of an end surface e1 of the panel. The circuit section 110B is provided so as to correspond to not a peripheral region of the pixel section 110A but the pixel section 110A. Specifically, in the display device 1, a floor (a first floor F1) including the circuit section 110B and a floor (a second floor F2) including the pixel section 110A are laminated. Herein, the first floor F1 and the second floor F2 are formed in this order on the driving side substrate 11. A sealing substrate 12 is provided on the second floor F2. The signal line driving circuit 120 and the scanning line driving circuit 130 of the circuit section 110B are electrically connected to a pad section 140 for connection to an external device via wiring (not illustrated).

The first floor F1 is a floor including constituent elements (circuit elements such as a shift register circuit, a buffer circuit, and a logic circuit) of the circuit section 110B. In the present embodiment, the circuit elements of the circuit section 110B are formed to be biased (densely) toward a selective region in the first floor F1. Specifically, an XY planar shape of the pixel section 110A (a display region A) is a rectangular shape, and the circuit section 110B is formed in a region corresponding to three sides of the rectangular shape. In other words, the display device 1 has a portion (laminate portion B1) in which the pixel section 110A and the circuit section 110B are laminated so as to correspond to the three sides of the rectangular shape of the display region A.

The second floor F2 is a floor including constituent elements (for example, the organic EL element 10, the write transistor WSTr, the driving transistor DRTr, and the capacitor Cs) of the pixel section 110A. However, although details thereof will be described later, all the constituent elements of the pixel section 110A are not necessarily formed in the second floor F2, and some constituent elements may be formed in the first floor F1.

Figure 4:
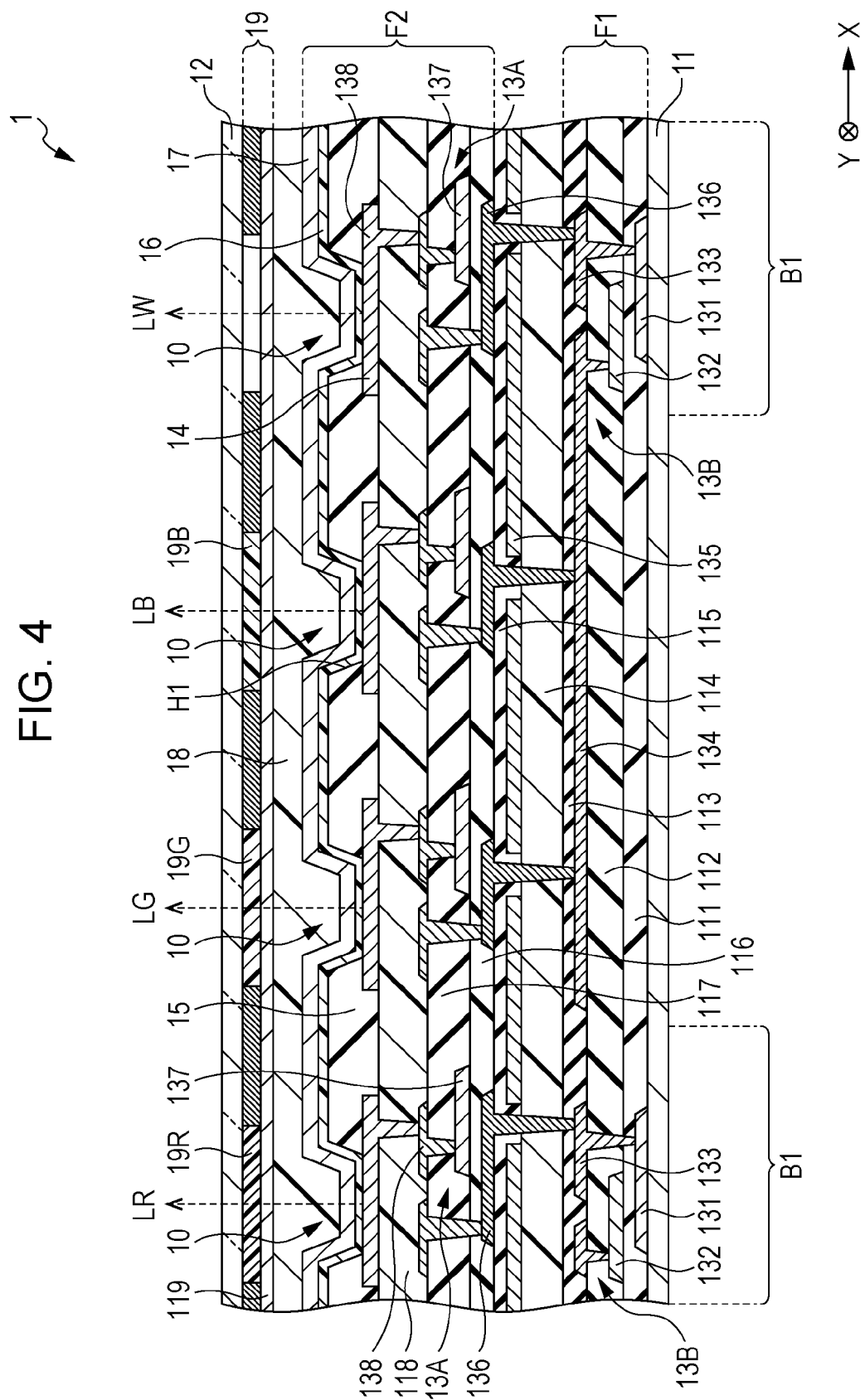
FIG. 4 is a cross-sectional view illustrating a configuration of the display device illustrated in FIG. 1.

FIG. 4 illustrates a specific cross-sectional configuration of the display device 1. In addition, FIG. 4 illustrates only regions corresponding to four pixels of R, G, B, and W. Further, a scale, the number of pixels, a position of the laminate portion B1, and the like are not different from actual ones. The display device 1 is, for example, a top emission type organic electroluminescent device, and is provided with the first floor F1 including the circuit section 110B and the second floor F2 including the pixel section 110A between the driving side substrate 11 and the sealing substrate 12 as described above. Hereinafter, each constituent element will be described.

The driving side substrate 11 is formed of a substrate such as glass. However, the driving side substrate 11 is not limited to glass, and may be made of, for example, quartz or resin. The sealing substrate 12 is formed of a transparent glass such as glass. In a case of a top emission type, as long as the sealing substrate 12 is transparent, the driving side substrate 11 may be made of a material which is not transparent.

First Floor F1

The first floor F1 includes a plurality of circuit elements as the circuit section 110B, and various elements (transistors and capacitive elements) are formed in the laminate portion B1. However, FIG. 4 illustrates only a transistor 13B as an example. The transistor 13B has a gate electrode 131, a semiconductor layer 132, and an electrode layer 133 on the driving side substrate 11. A gate insulating film 111 is formed between the gate electrode 131 and the semiconductor layer 132, and an interlayer insulating film 112 is formed between the semiconductor layer 132 and the electrode layer 133. An interlayer insulating film 113 is formed on the electrode layer 133. In the present embodiment, a wiring layer 134 such as a power supply line wiring is disposed in a region (a region 110C in FIG. 3A) other than the laminate portion B1 inside the first floor F1.

The gate electrode 131 is made of, for example, molybdenum (Mo). The semiconductor layer 132 is made of, for example, low temperature polysilicon (LTPS). The electrode layer 133 is, for example, an electrode which functions as a source or a drain, a signal line wiring, or a power supply line wiring. The electrode layer 133 is, for example, a multilayer film (Ti/Al or Ti/Al/Ti) in which titanium (Ti) and aluminum (Al). In FIG. 4, portions illustrated as the transistors "13A" and "13B" do not strictly form structures of transistors, but description thereof is made as the structure. The illustrated portions correspond to layer structures in which the transistors 13A and 13B are respectively formed. This is also the same for the subsequent cross-sectional views.

The gate insulating film 111 and the interlayer insulating films 112 and 113 are formed of an inorganic film such as a silicon oxide film, a silicon nitride film, a silicon oxynitride film, and an aluminum oxide film, and may be a single layer formed of one thereof, and may be a laminate film formed of two or more films.

A planarization film 114 is formed on the interlayer insulating film 113. The planarization film 114 is formed of an organic film such as an acrylic resin. A shield layer 135 is formed on the planarization film 114.

The shield layer 135 is formed of, for example, a laminate film (Ti/Al/Ti) of titanium and aluminum, or ITO. The shield layer 135 has a laser light shielding function for preventing laser light used in a procedure of forming the second floor F2 from reaching the first floor F1. A formation region of the shield layer 135 is not particularly limited, but is formed on substantially the entire surface of the driving side substrate 11 except for an interlayer connection portion (contact portion) between the first floor F1 and the second floor F2. An interlayer insulating film 115 is formed to cover the shield layer 135, and the second floor F2 is formed on the interlayer insulating film 115. In other words, the second floor F2 is formed on the first floor F1 via the planarization film 114, the shield layer 135, and the interlayer insulating film 115. However, the shield layer 135 may not necessarily be provided.

Second Floor F2

The second floor F2 includes the plurality of pixels PXLC as the pixel section 110A, and is provided with the above-described constituent elements (the organic EL element 10, the capacitor Cs, the write transistor WSTr, and the driving transistor DRTr) over the entire region of the first floor F1. However, FIG. 4 illustrates only the transistor 13A (corresponding to the driving transistor DRTr) and the organic EL element 10 which are some of the constituent elements of the pixel PXLC.

The transistor 13A has a gate electrode 136, a semiconductor layer 137, and a source/drain electrode 138 on the interlayer insulating film 115. A gate insulating film 116 is formed between the gate electrode 136 and the semiconductor layer 137, and an interlayer insulating film 117 is formed between the semiconductor layer 137 and the source/drain electrode 138. A planarization film 118 is formed on the source/drain electrode 138. The transistor 13A is formed to overlap the transistor 13B formed in the first floor F1 in a plan view.

The gate electrode 136 is made of, for example, molybdenum (Mo). The semiconductor layer 137 is made of, for example, low temperature polysilicon (LTPS). The source/drain electrode 138 is an electrode which functions as, for example, a source or a drain, and is made of the same material as that of the electrode layer 133. The capacitor Cs is not illustrated in FIG. 4, but is formed by using the layer structures of the gate electrode 136, the gate insulating film 116, and the semiconductor layer 137. The gate insulating film 116 and the interlayer insulating film 117 are formed of an inorganic film such as a silicon oxide film, a silicon nitride film, a silicon oxynitride film, and an aluminum oxide film, and may be a single layer formed of one thereof, and may be a laminate film formed of two or more films. As mentioned above, in the present embodiment, both of the transistor 13A and the transistor 13B formed in the laminate portion B1 include LTPS (the semiconductor layers 132 and 137 are made of LTPS). For this reason, there is a concern about influence on characteristics of the transistor 13B due to irradiation with laser light when the transistor 13A is formed, but since the shield layer 135 is provided between the first floor F1 and the second floor F2 as described above, influence of the laser light on the transistor 13B is reduced. However, the shield layer 135 may not necessarily be provided, and, in this case, a laser irradiation condition is appropriately set, and thus the transistors 13A and 13B having desired characteristics can be formed.

In the first floor F1 and the second floor F2, the transistors 13A and 13B may be formed by using different materials. For example, the transistor 13B of the first floor F1 may contain LTPS, and the transistor 13A of the second floor F2 may contain a transparent oxide semiconductor (TOS). In other words, the semiconductor layer 132 may be made of LTPS, and the semiconductor layer 137 may be made of a transparent oxide semiconductor. In this case, since characteristics of the transistor 13B are hardly influenced when the transistor 13A is formed, characteristics of each of the transistors 13A and 13B can be easily controlled. In addition, a laser irradiation step is not necessary when the second floor F2 is formed, and thus data control on the first floor F1 is not necessary. Further, the circuit section can be formed by using a complementary metal-oxide semiconductor (CMOS) structure in the first floor F1.

Alternatively, both of the transistor 13B of the first floor F1 and the transistor 13A of the second floor F2 may contain a TOS (the semiconductor layers 132 and 137 may be made of the TOS). Still alternatively, the transistor 13B of the first floor F1 may contain a TOS, and the transistor 13A of the second floor F2 may contain LTPS (the semiconductor layer 132 may be made of the TOS, and the semiconductor layer 137 may be made of LTPS). In addition, materials thereof are not limited to LTPS and a TOS, and other semiconductors, for example, amorphous silicon, microcrystalline silicon, or high temperature polysilicon (HTPS) may be used.

The planarization film 118 is formed of an organic film such as an acrylic resin. The organic EL element 10 is formed on the planarization film 118 for each pixel PXLC.

The organic EL element 10 has a first electrode 14, an organic layer 16, and a second electrode 17 in this order from the driving side substrate 11 side. The first electrode 14 is provided for each pixel, and an inter-pixel insulating film 15 is formed on the first electrode 14 through all the pixels. The inter-pixel insulating film 15 has an opening H1 so as to correspond to the first electrode 14. The first electrode 14 is in contact with the organic layer 16 in the opening H1. The second electrode 17 is formed throughout all the pixels so as to cover, for example, the organic layer 16. The sealing substrate 12 is joined onto the second electrode 17 via a resin layer 18 including a protective film and a sealing resin. A BM/CF layer 19 is formed on one surface (a surface facing the organic EL element 10) of the sealing substrate 12. The organic EL element 10 is a white light emitting element. White light emitted from the organic EL element 10 passes through the BM/CF layer 19, and is thus separated and extracted as color light (LR, LG, LB, or LW) of any one of R, G, B, and W.

The first electrode 14 is a reflective electrode which reflects light. In a case of functioning as an anode, the first electrode 14 is preferably made of, for example, simple metal such as aluminum (Al), platinum (Pt), gold (Au), silver (Ag), chromium (Cr), tungsten (W), nickel (Ni), copper (Cu), iron (Fe), cobalt (Co), and tantalum (Ta), or an alloy including at least one species thereof. As the alloy, there is, for example, an Ag—Pd—Cu alloy (an alloy of silver, palladium, and copper), or an Al—Nd alloy. Alternatively, the first electrode 14 may be a laminate film of a film made of the above-described metal and a transparent conductive film. The first electrode 14 is preferably made of a material with a high hole injection property, but, even a material (aluminum (Al), an alloy including aluminum, or the like) otherwise may be used as an anode by providing an appropriate hole injection layer therein. As the transparent conductive film, there may be indium tin oxide (ITO), indium zinc oxide (InZnO), and an alloy of zinc oxide (ZnO) and aluminum (Al).

The inter-pixel insulating film 15 defines (partitions) a pixel opening (an emission region or an emission opening), and electrically separates the first electrodes 14 from each other. The inter-pixel insulating film 15 is made of an organic material such as an acrylic resin or polyimide.

The organic layer 16 includes an organic electroluminescent layer in which application of an electric field causes recombination of electrons and holes and then color light is generated. Herein, the organic layer 16 includes, for example, a white light emitting layer which generates white light, and is formed for all the pixels. The white light emitting layer has a structure in which, for example, a red light emitting layer, a green light emitting layer, and a blue light emitting layer are laminated, or a structure in which a blue light emitting layer and a yellow light emitting layer are laminated. However, a configuration of the organic layer 16 is not limited thereto, and each pixel may be painted in a color. Specifically, any one of a red light emitting layer, a green light emitting layer, a blue light emitting layer, and a white light emitting layer may be formed for each pixel PXLC. In addition, the organic layer 16 may include not only the organic electroluminescent layer but also, for example, a hole injection layer, a hole transport layer, and an electron transport layer. An electron injection layer or the like may be formed between the organic layer 16 and the second electrode 17.

The second electrode 17 has an appropriate work function, and is made of a conductive material through which light is transmitted, for example, a transparent conductive film such as indium tin oxide (ITO) or indium zinc oxide (IZO). As a material forming the second electrode 17, there may be an alloy of magnesium and silver (MgAg alloy).

The resin layer 18 includes a protective film formed of an inorganic film such as a silicon nitride film, and a sealing resin formed of, for example, an epoxy resin.

The BM/CF layer 19 is provided in all the pixels on a light emission side of the second electrode 17. The BM/CF layer 19 is a layer including a light blocking portion (black matrix) whose XY planar shape is a lattice shape, and color filters (a red filter 19R, a green filter 19G, and a blue filter 19B) formed in lattice shaped opening portions. The red filter 19R, the green filter 19G, and the blue filter 19B are formed to respectively face the organic EL elements 10. The red filter layer 19R selectively transmits red light therethrough and absorbs other wavelengths, the green filter layer 19G selectively transmits green light therethrough and absorbs other wavelengths, and the blue filter layer 19B selectively transmits green light and absorbs other wavelengths. In addition, a color filter is not provided in the W pixel, and white light emitted from the organic layer 16 is extracted onto the sealing substrate 12 as it is. Alternatively, an optical filter may be provided in the W pixel in order to adjust luminance or chromaticity. A surface (a surface on the organic EL element 10 side) of the BM/CF layer 19 is covered with an overcoat layer 119.

Operations and Effects

In the display device 1 of the present embodiment, when a driving current is supplied to the organic layer 16 via the first electrode 14 and the second electrode 17, color light (for example, white light) is generated in the organic EL element 10. This white light is transmitted through the second electrode 17, the resin layer 18, the BM/CF layer 19, and the sealing substrate 12, and is emitted upward as light LR, LG, LB, and LW. In the above-described manner, an image is displayed.

Here, a general organic EL display has a non-display region called a frame around an active display region of a panel. Driving circuits are disposed in this frame.

Figure 5:
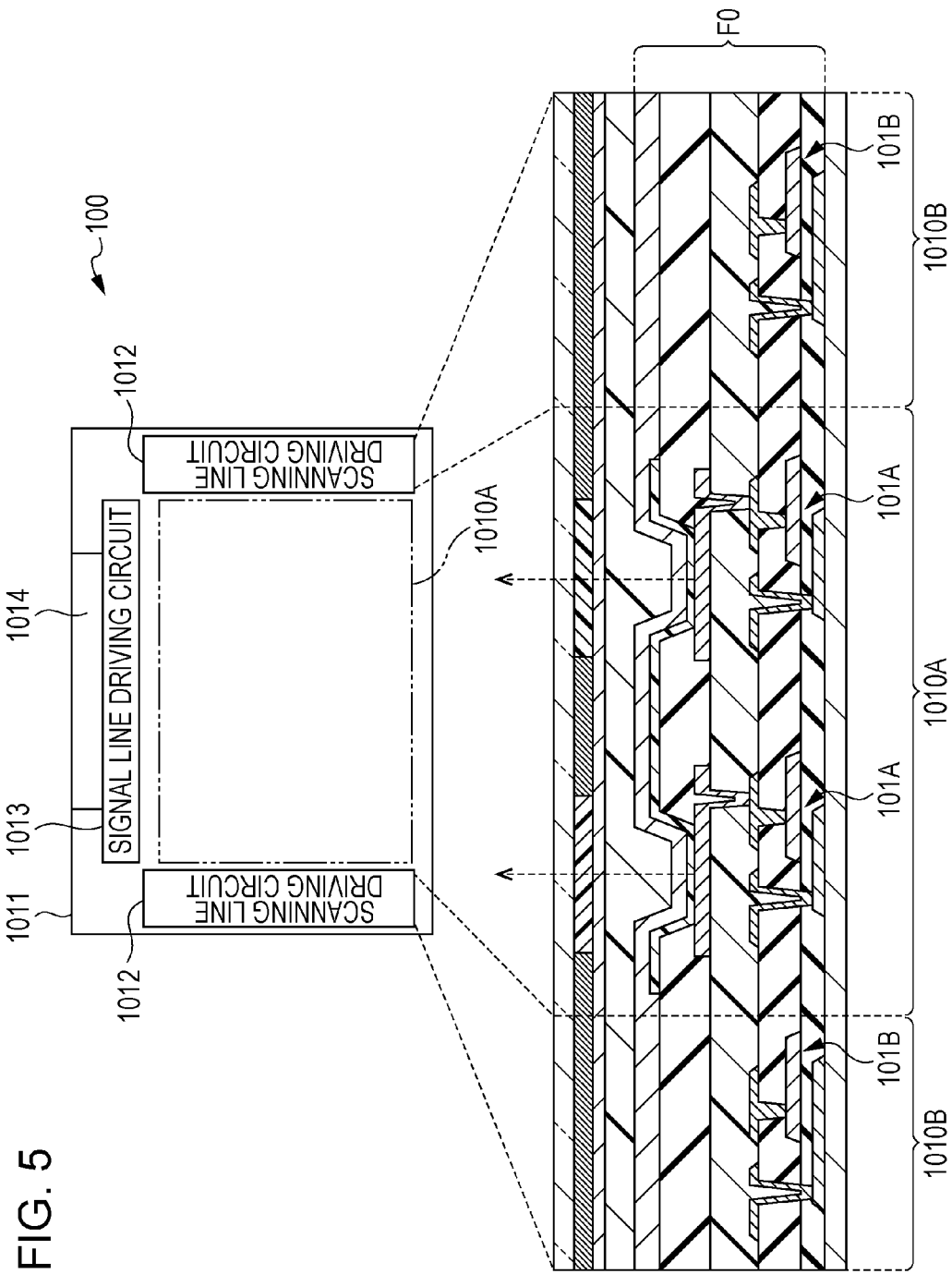
FIG. 5 is a schematic diagram illustrating a planar configuration and a cross-sectional configuration of a display device related to Comparative Example 1.

FIG. 5 illustrates a planar configuration (upper figure) and a cross-sectional configuration (lower figure) of a display device (display device 100) related to a comparative example (Comparative Example 1) of the present embodiment. The display device 100 has a pixel section 1010A including a plurality of pixels (pixel circuits) on a driving side substrate 1011. A circuit section 1010B including a signal line driving circuit 1012 and a scanning line driving circuit 1013 are formed around the pixel section 1010A. In other words, in Comparative Example 1, the pixel section 1010A and the circuit section 1010B are formed in the same floor F0. Specifically, a transistor 101A which is a constituent element of the pixel section 1010A and a transistor 101B which is a constituent element of the circuit section 1010B are formed in parallel to each other in an in-surface direction of the driving side substrate 1011. The transistor 101A and the transistor 101B are patterned and formed in the same step.

In the display device 100 of the Comparative Example 1, the circuit section 1010B is formed around the pixel section 1010A as described above. A frame is preferably secured as a space for disposing the circuit section 1010B. Particularly, in a small or medium-sized display, it is hard to reduce an occupation area of the circuit section 1010B, and it is difficult to narrow a frame.

In contrast, in the display device 1 of the present embodiment, the circuit section 110B is not formed around the pixel section 110A, but the first floor F1 including the circuit section 110B and the second floor F2 including the pixel section 110A are laminated. Specifically, the first floor F1 and the second floor F2 are formed in this order on the driving side substrate 11.

With this configuration, it is not necessary to secure a space for disposing the circuit section 110B around the pixel section 110A. In other words, a space for disposing the circuit section 110B in the peripheral region of the pixel section 110A is reduced.

In addition, the laminate portion B1 in which the pixel section 110A and the circuit section 110B overlap each other is provided in the region corresponding to three sides of the rectangular shape of the pixel section 110A. Consequently, for example, the wiring layer 134 can be formed in the region 110C (a region other than the laminate portion B1) in which the circuit section 110B is not formed in the first floor F1. For this reason, a degree of freedom of a wiring layout is improved. In addition, since a sufficiently large line width of the wiring layer 134 can be secured, the wiring layer 134 can be formed to have desired impedance. Further, a functional element or an electrochromic element can be disposed in the region 110C in addition to the wiring layer 134. Consequently, for example, it is possible to implement a display with a touch sensor function or a display which can switch between a transparent mode and an opaque mode (described later). As mentioned above, in a case where the circuit section 110B is disposed to be biased in the first floor F1, a space (the region 110C) is generated in the first floor F1, and thus this space can be used for various usages.

As described above, in the present embodiment, the pixel section 110A having the plurality of pixels PXLC which are arranged in a two-dimensional manner, and the circuit section 110B which drives the plurality of pixels PXLC for display are provided, and the first floor F1 including the circuit section 110B and the second floor F2 including the pixel section 110A are laminated. Consequently, it is possible to reduce a space for disposing the circuit section 110B in the peripheral region of the pixel section 110A. Therefore, it is possible to realize a narrow frame or a non-frame.

Next, other embodiments and modification examples of the first embodiment will be described. The same constituent elements as in the first embodiment are given the same reference numerals, and description thereof will be omitted as appropriate.

Modification Example 1

Figure 6:
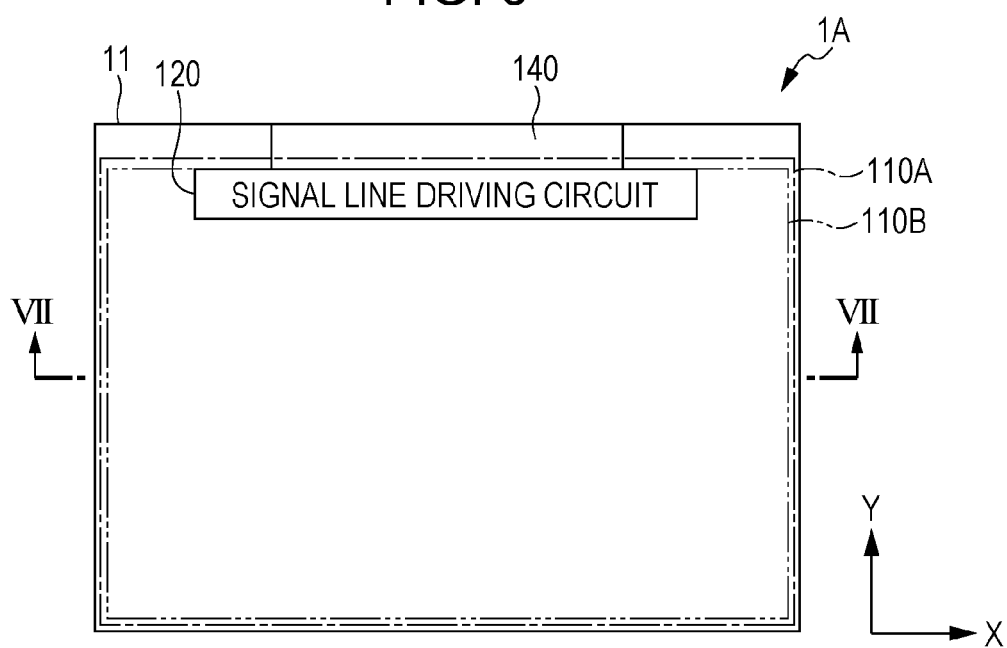
FIG. 6 is a schematic plan view illustrating a layout of a pixel section and a circuit section of a display device related to Modification Example 1.
Figure 7:
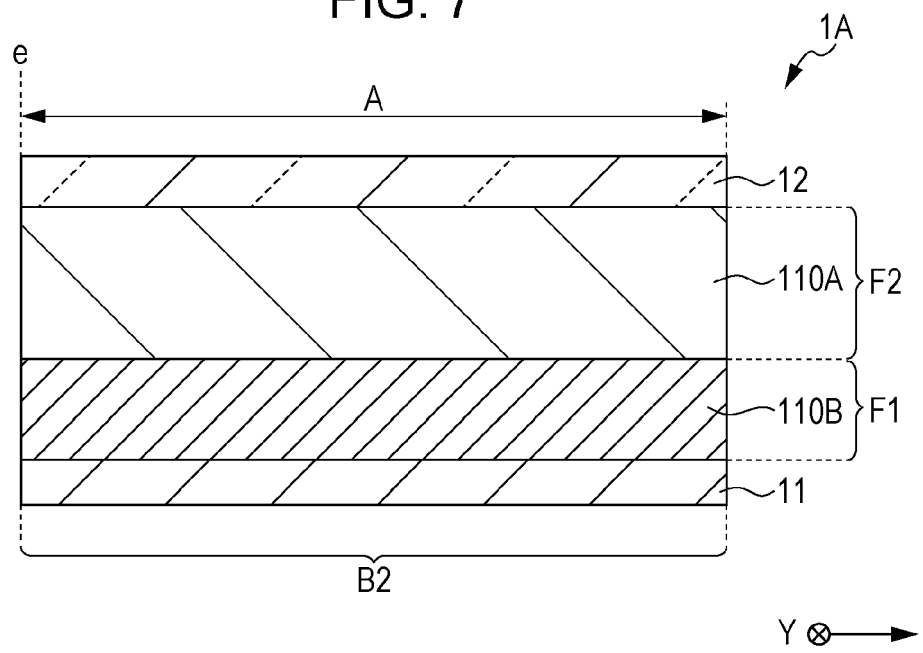
FIG. 7 is a schematic cross-sectional view illustrating the layout of the pixel section and the circuit section illustrated in FIG. 6.

FIG. 6 is a schematic plan view for explaining a layout of a pixel section 110A and a circuit section 110B of a display device (display device 1A) related to a modification example (Modification Example 1) of the first embodiment. FIG. 7 is a cross-sectional view taken along the line VII-VII of FIG. 6. In the above-described first embodiment, a case has been described in which the circuit section 110B is formed to be biased toward the selective region (a region corresponding to three sides of a rectangular shape) in the first floor F1, but, a layout of the circuit section 110B is not limited thereto. For example, as in the present modification example, a plurality of circuit elements constituting the circuit section 110B may be disposed in a distribution manner in the first floor F1. In other words, the circuit section 110B is formed over the entire region of the first floor F1, and the entire display region A becomes a laminate portion B2 in which the pixel section 110A and the circuit section 110B are laminated.

Figure 8A:
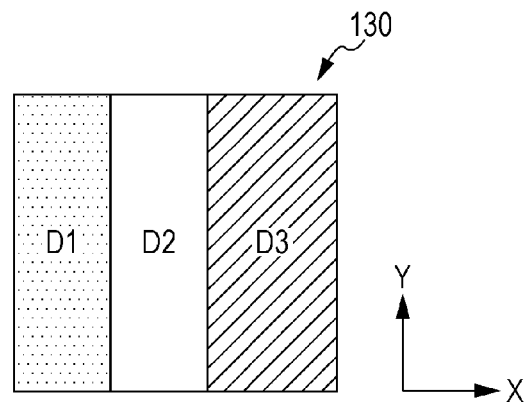
FIG. 8A is a schematic diagram illustrating a configuration example of the circuit section.
Figure 8B:
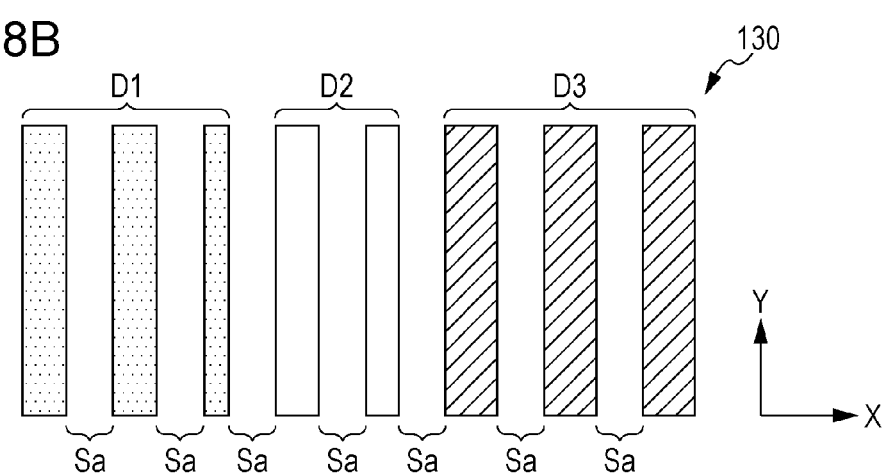
FIG. 8B is a schematic diagram illustrating a configuration example of the circuit section.
Figure 8C:
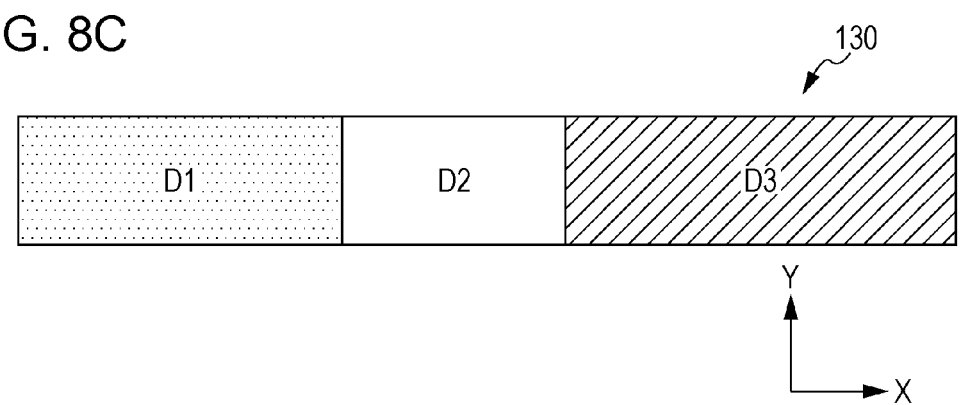
FIG. 8C is a schematic diagram illustrating a configuration example of the circuit section.

FIGS. 8A to 8C schematically illustrate examples of a layout of circuit elements (circuit elements D1, D2 and D3) of the circuit section 110B. As illustrated in FIG. 8A, in a case where the circuit section 110B is disposed only in a predetermined region as in the first embodiment, for example, the circuit elements D1 to D3 of the scanning line driving circuit 130 are disposed densely without a gap so as to enter a predetermined region. On the other hand, as in the present modification example, in a case where the laminate portion B2 is formed in the entire display region A, for example, as illustrated in FIG. 8B, each of the circuit elements D1 to D3 can be subdivided and disposed with a gap Sa. Alternatively, as illustrated in FIG. 8C, the circuit elements D1 to D3 may be disposed in an elongated region which extends in the X direction. The scanning line driving circuit 130 is generally formed to extend in the Y direction in a region corresponding to one side of the pixel section 110A, but, in the present modification example, an extent of a layout restriction of the circuit section 110B is low, and thus the scanning line driving circuit 130 may be formed to extend in the X direction. The circuit elements D1 to D3 which extend in the X direction may be arranged in a plurality.

As mentioned above, the circuit elements of the circuit section 110B may be disposed in a distribution manner in the first floor F1, and thus a degree of freedom of a layout of the circuit section 110B is improved. In addition, since density of the circuit elements is reduced due to the distributed arrangement of the circuit section 110B, it is possible to increase transparency of the display region A by forming a transmissive window in a vacant region (details thereof will be described later). The above-described layouts of the circuit section 110B are only an example, and various layouts may be employed according to usage or layouts of other elements.

Modification Example 2

Figure 9:
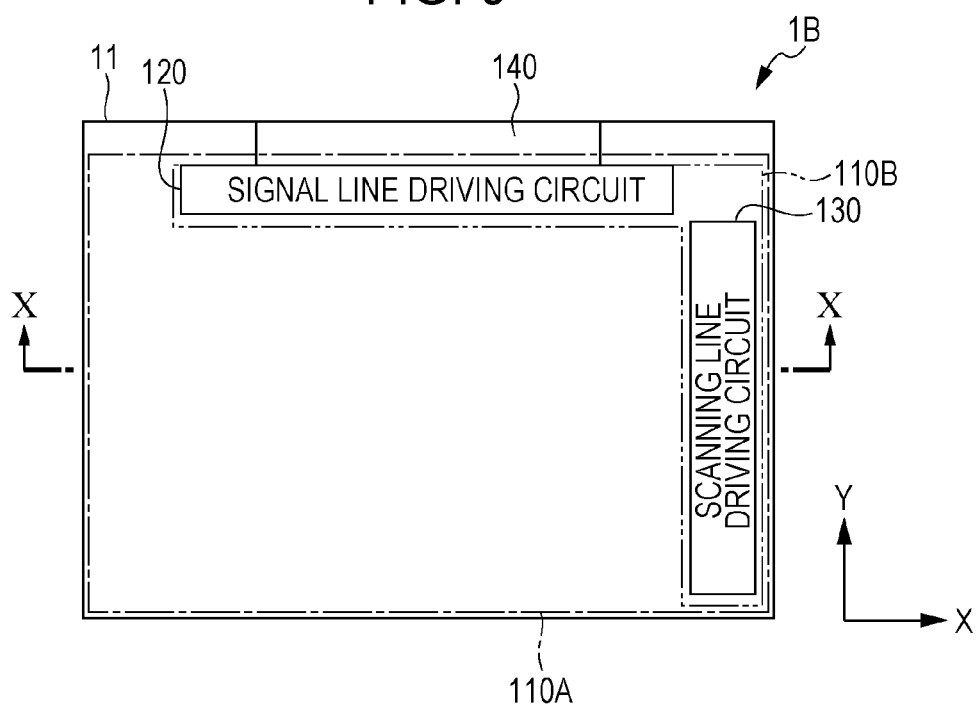
FIG. 9 is a schematic plan view illustrating a layout of a pixel section and a circuit section of a display device related to Modification Example 2.
Figure 10:
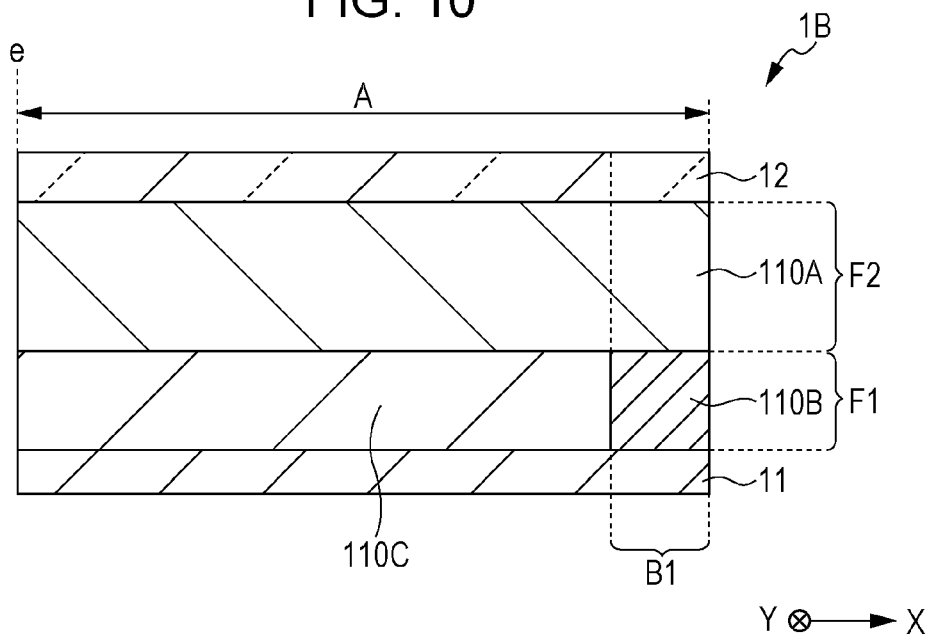
FIG. 10 is a schematic cross-sectional view illustrating the layout of the pixel section and the circuit section illustrated in FIG. 9.
Figure 11:
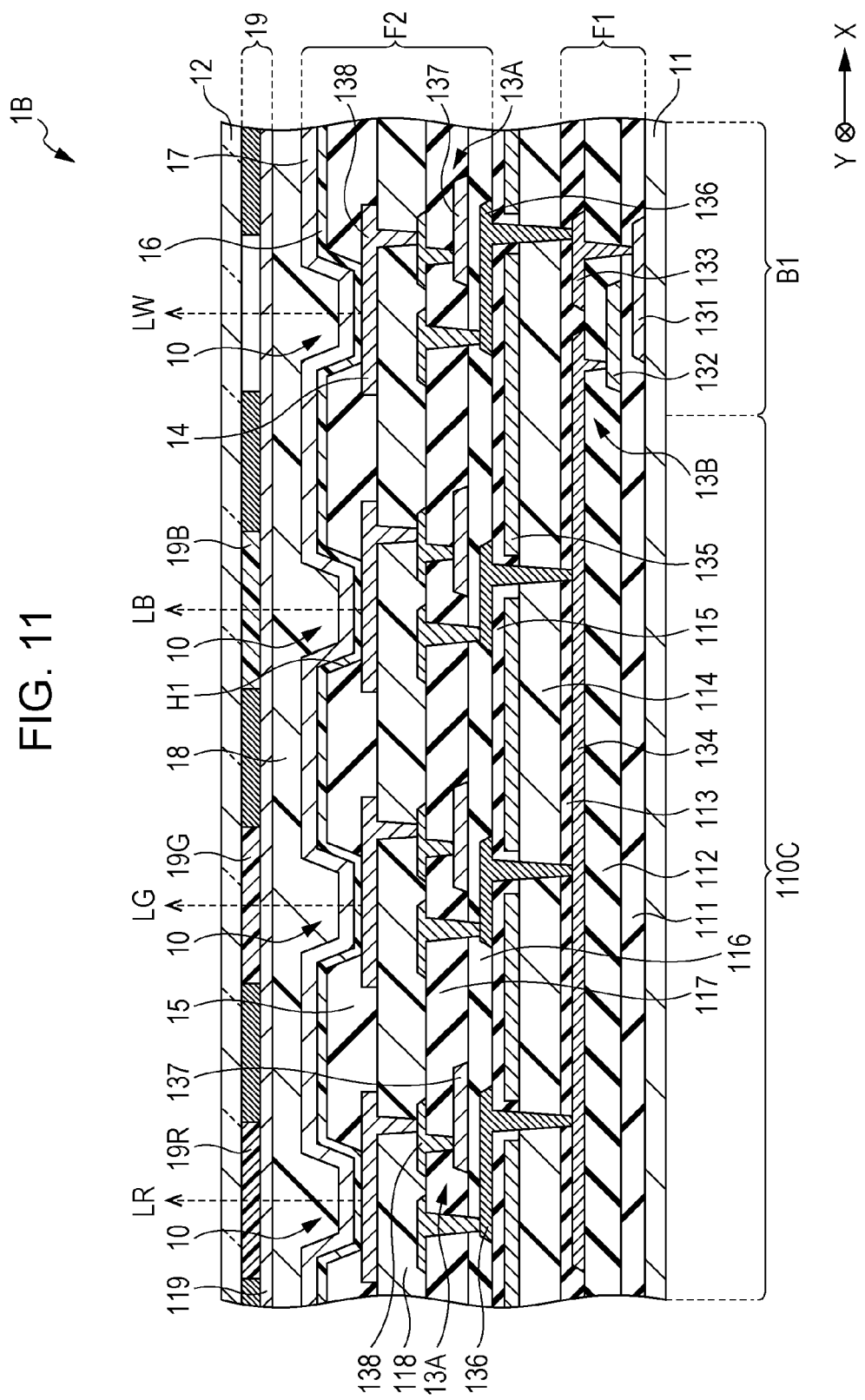
FIG. 11 is a cross-sectional view illustrating a configuration of the display device illustrated in FIG. 9.

FIG. 9 is a schematic plan view for explaining a layout of a pixel section 110A and a circuit section 110B of a display device (display device 1B) related to a modification example (Modification Example 2) of the first embodiment. FIG. 10 is a cross-sectional view taken along the line X-X of FIG. 9. In the above-described first embodiment, a case has been described in which the circuit section 110B is formed to be biased toward the selective region (a region corresponding to three sides of a rectangular shape) in the first floor F1, but, a layout of the circuit section 110B is not limited thereto. For example, as in the present modification example, a plurality of circuit elements constituting the circuit section 110B may be disposed in a region corresponding to two sides of a rectangular shape in the first floor F1. Specifically, the scanning line driving circuit 130 of the circuit section 110B is provided to be integrated in one side of the rectangular shape. Also in this case, the wiring layer 134 can be formed in the region 110C other than the laminate portion B1 of the pixel section 110A and the circuit section 110B in the first floor F1 in the same manner as in the first embodiment. An example thereof is illustrated in FIG. 11. Alternatively, the above-described functional element may be formed in the region 110C.

As mentioned above, the scanning line driving circuit 130 is formed to be integrated in a region corresponding to one side (one side different from that of the signal line driving circuit 120) of the rectangular shape, that is, the circuit portions are formed to be integrated in two sides of the rectangular shape, and thus the following effects are achieved in the transparent display usage which will be described later. Although details thereof are described later, a transmissive window is provided in the pixel section 110A of the second floor F2 in a region corresponding to two sides in which the circuit portions are not integrated, and thus it is possible to implement a frameless two-sided transparent display. In addition, the signal line driving circuit 120 and the scanning line driving circuit 130 may be disposed so as to be integrated in one side of the rectangular shape, and, in this case, a frameless three-sided transparent display can be implemented.

Second Embodiment

As described in the first embodiment, a degree of freedom of a layout in the first floor F1 is improved through a laminate of the pixel section 110A and the circuit section 110B (laminate of the first floor F1 and the second floor F2), and thus the circuit section 110B can be disposed in a distribution manner. By using the distributed arrangement of the circuit section 110B, it is possible to implement, for example, a transparent display which is light-transmissive and allows scenery on a rear side to be viewed.

Figure 12:
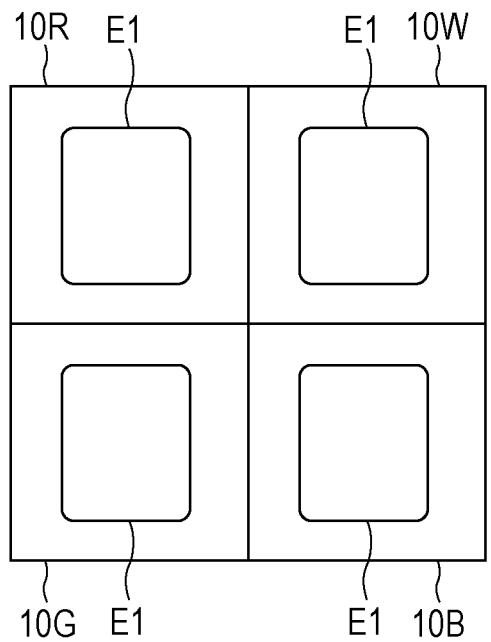
FIG. 12 is a schematic diagram for explaining a pixel configuration of a general display device.
Figure 13:
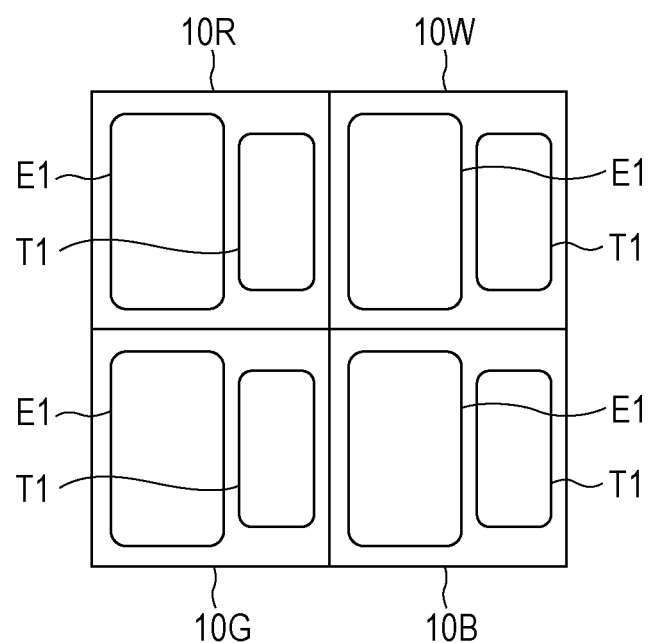
FIG. 13 is a schematic diagram illustrating a pixel configuration of a transparent display device.

Here, in a general display, as illustrated in FIG. 12, a light emitting portion E1 (light emitting opening) of each of, for example, four pixels 10R, 10G, 10B and 10W is formed, and light is emitted from only the light emitting portion E1. In contrast, as illustrated in FIG. 13, in a transparent display, a light emitting portion E1 and a light-transmissive window (transmissive portion T1) is formed in each of pixels 10R, 10G, 10B and 10W. Each pixel can transmit light through the transmissive portion T1, and thus it is possible to implement a display having transparency.

Figure 14:
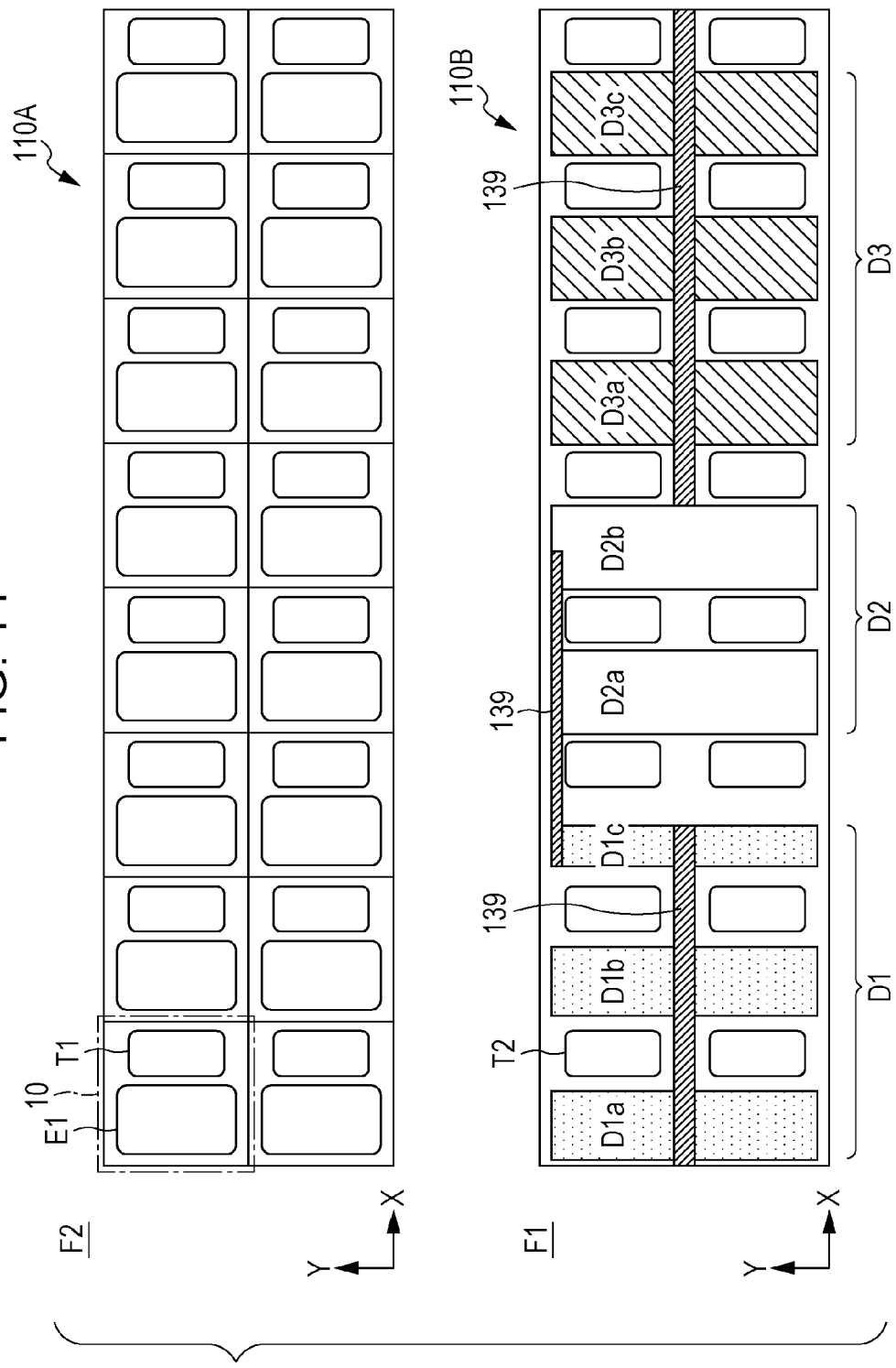
FIG. 14 is a schematic diagram illustrating a planar configuration of a first floor including a driving circuit section and a planar configuration of a second floor including a pixel section in a display device according to a second embodiment of the present disclosure.

FIG. 14 is an XY plan view illustrating configurations of main portions of a display device (display device 2) of a second embodiment of the present disclosure. In FIG. 14, an upper figure illustrates a configuration of main portions of the second floor F2 including the pixel section 110A, and a lower figure illustrates a configuration of main portions of the first floor F1 including the circuit section 110B. As mentioned above, in the present embodiment, the light emitting portion E1 and the transmissive portion T1 are provided at each organic EL element 10 (at each pixel PXLC) in the second floor F2. In addition, a transmissive portion T2 is also provided in the first floor F1. In the same manner as in the above-described Modification Example 1, the circuit elements D1 to D3 of the circuit section 110B are disposed in a distribution manner in the first floor F1, and the transmissive portion T2 is formed in a gap which is generated due to the distributed arrangement. The transmissive portion T2 in the first floor F1 and the transmissive portion T1 in the second floor F2 are provided at positions which communicate with each other in the laminate direction, and light is transmitted through the transmissive portions T1 and T2. In the first floor F1, a wiring layer 139 which electrically connects the circuit elements D1, D2 and D3 to each other is disposed so as to avoid the transmissive portion T2.

Figure 15:
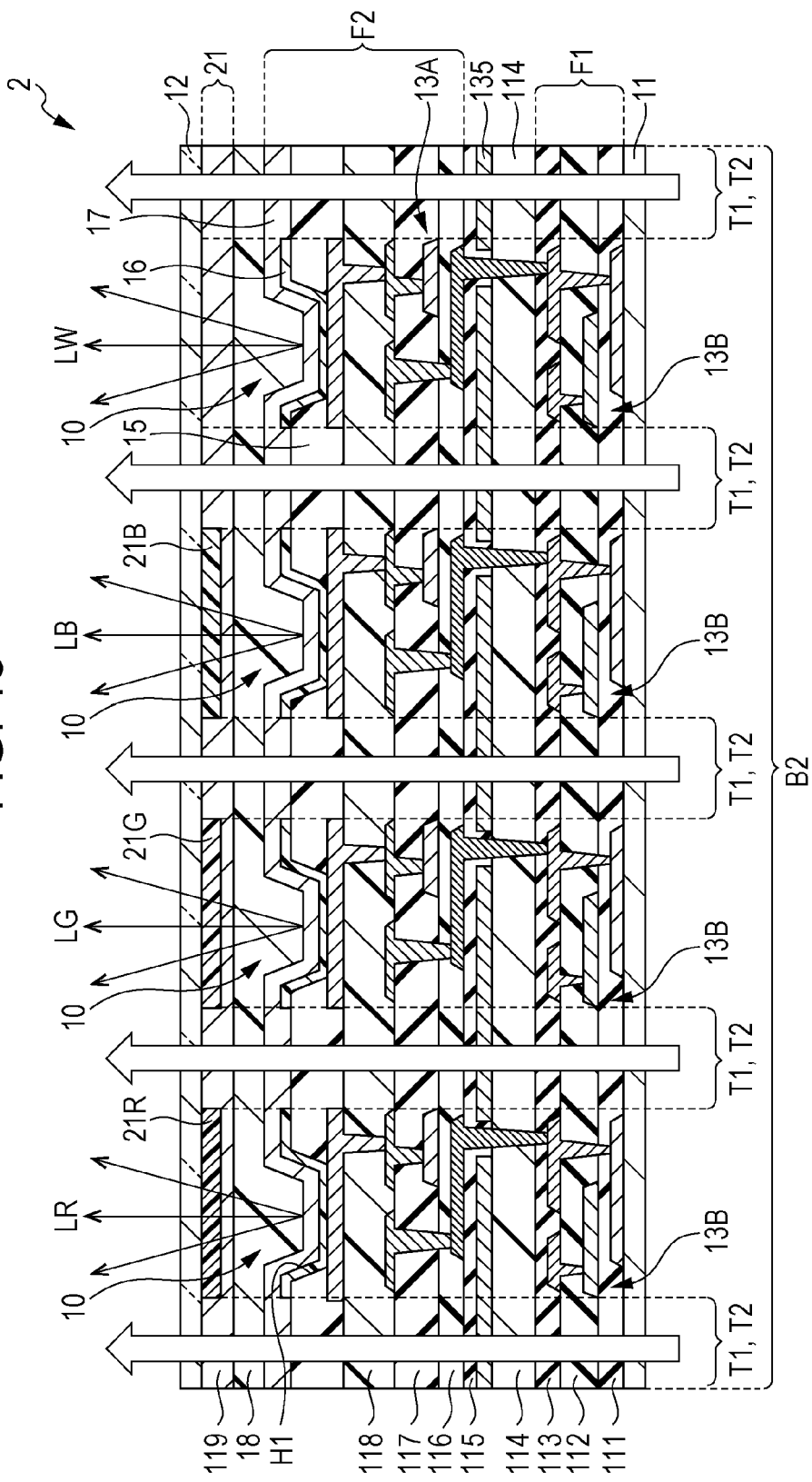
FIG. 15 is a cross-sectional view illustrating the entire configuration of the display device including the first floor and the second floor illustrated in FIG. 14.

FIG. 15 illustrates a specific cross-sectional configuration of the display device 2. As mentioned above, the circuit elements of the circuit section 110B are disposed in a distribution manner in the first floor F1 (only the transistor 13B is illustrated here), and light is transmitted through the transmissive portions T1 and T2 which communicate with each other in the laminate direction. In the present embodiment, a black matrix is not formed, and a CF layer 21 including a red filter 21R, a green filter 21G, and a blue filter 21B is formed on the resin layer 18. A surface of the CF layer 21 is covered with an overcoat layer 119.

Figure 16:
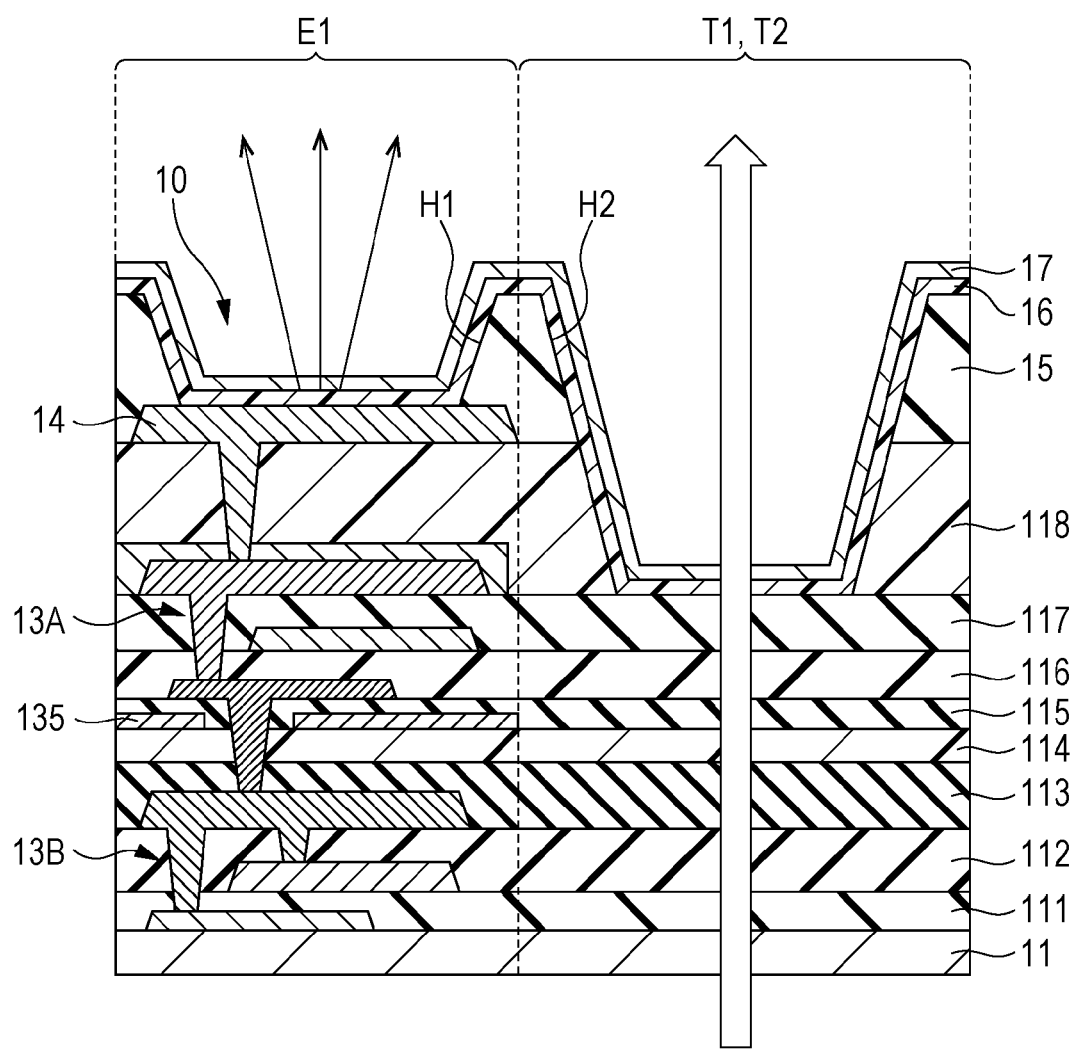
FIG. 16 is an enlarged cross-sectional view of the vicinity of a transmissive portion of the display device illustrated in FIG. 15.

FIG. 16 illustrates an enlarged element structure near the light emitting portion E1 and the transmissive portions T1 and T2. As mentioned above, the transistors 13A and 13B overlap each other and the organic EL element 10 is formed in a region corresponding to the light emitting portion E1. An opaque layer such as a metal is provided to avoid the transmissive portions T1 and T2. On the other hand, films having relatively high transparency are laminated in regions corresponding to the transmissive portions T1 and T2. A layer having low transparency due to a material or a thickness (for example, here, the planarization film 118 and the inter-pixel insulation film 15) is provided with an opening (opening H2) or a thickness thereof is reduced, and thus light transmission is increased. In addition, in FIG. 16, portions illustrated as the transistors "13A" and "13B" do not strictly form structures of transistors, but description thereof is made as the structure. The illustrated portions correspond to layer structures in which the transistors 13A and 13B are respectively formed.

Also in the display device 2 of the present embodiment, the first floor F1 including the circuit section 110B and the second floor F2 including the pixel section 110A are laminated, and thus a space for disposing the circuit section 110B in the peripheral region of the pixel section 110A is reduced. Therefore, an effect equal to that of the above-described first embodiment can be achieved. In addition, the circuit section 110B is disposed in a distribution manner in the first floor F1 so that the transmissive portions T1 and T2 which communicate with each other in the first floor F1 and the second floor F2 can be formed, and thus it is possible to implement a transparent display.

Figure 17A:
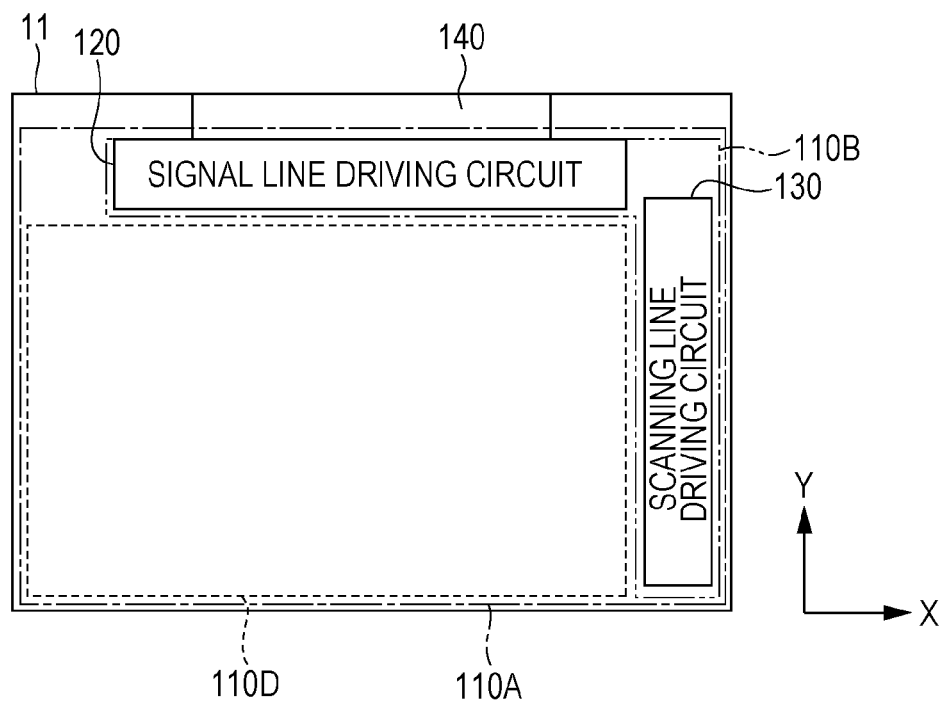
FIG. 17A is a schematic diagram for explaining a two-side transparent display.
Figure 17B:
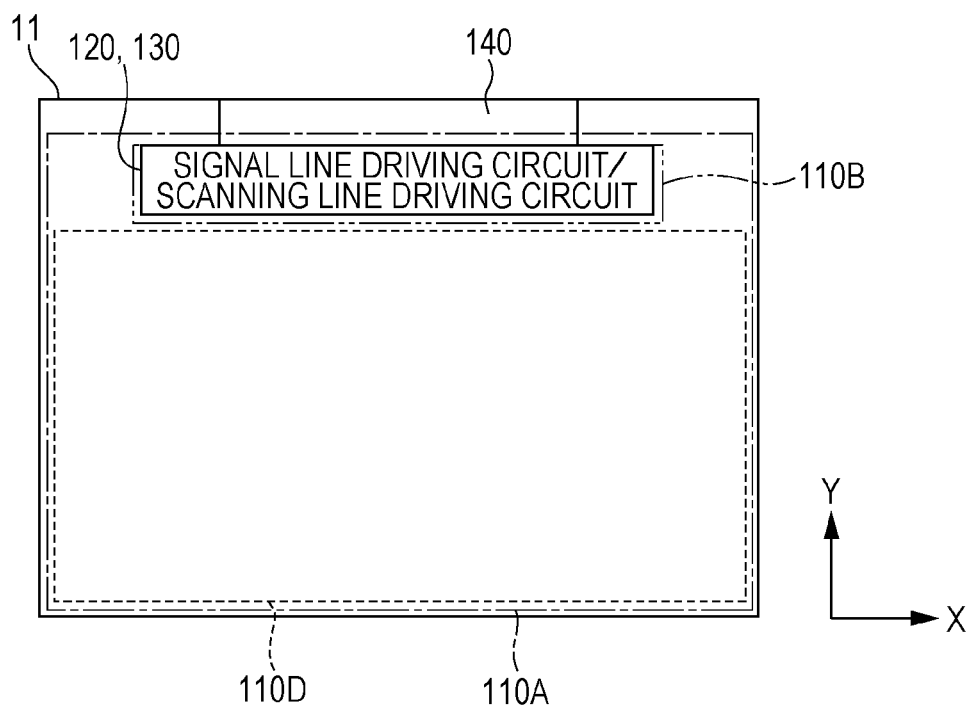
FIG. 17B is a schematic diagram for explaining a three-side transparent display.

As described in the above Modification Example 2, the scanning line driving circuit 130 is integrated in the region corresponding to one side (one side different from that of the signal line driving circuit 120) of the rectangular shape, that is, the circuit portions are formed to be integrated in two sides of the rectangular shape. The transmissive window is provided in the pixel section 110A of the second floor F2 of the region corresponding to the remaining two sides, and thus the region corresponding to the two sides, in which the circuit section 110B is not formed, is made to be transparent, and light can be emitted from an end surface, as illustrated in FIG. 17A. In other words, the region excluding the two sides in which the circuit section 110B is integrated becomes a transparent region (transparent region 110D), and thus a frameless two-sided transparent display can be implemented. In addition, the signal line driving circuit 120 and the scanning line driving circuit 130 may be disposed so as to be integrated in one side of the rectangular shape, and, in this case, a frameless three-sided transparent display can be implemented (FIG. 17B). Here, in this case, the scanning line WSL is formed to extend in the Y direction in the same manner as the signal line DTL. The scanning line WSL is interlayer-connected to a wiring which is formed in the X direction in another layer, at a crossing position.

Modification Example 3

Figure 18:
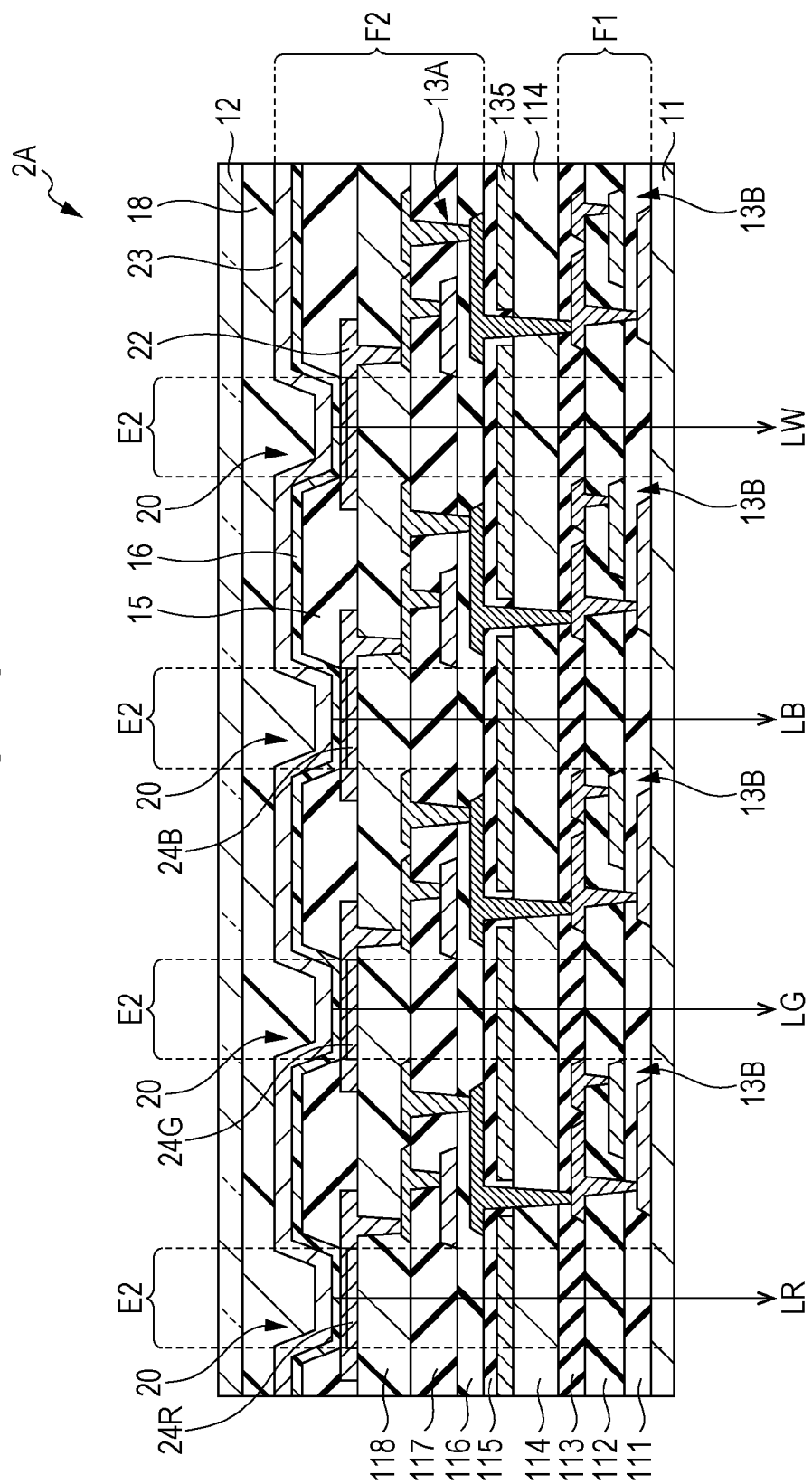
FIG. 18 is a cross-sectional view illustrating a configuration of a display device related to Modification Example 3.

FIG. 18 illustrates a cross-sectional configuration of a display device (display device 2A) related to a modification example (Modification Example 3) of the first and second embodiments. In the above-described embodiments and the like, the display device using the top emission type organic EL element 10 has been described as an example, but, as in the present modification example, a bottom emission type organic EL element (organic EL element 20) may be used. In the display device 2A of the present modification example, the circuit section 110B is disposed in a distribution manner in the first floor F1 in the same manner as in Modification Example 1 and the second embodiment, and thus light (a light emission color, or a light emission color and transmitted light) passes through a gap between the circuit elements. The organic EL element 20 has an organic layer 16 between a first electrode 22 and a second electrode 23. The organic EL element 20 (light emitting portion E2) is formed not to overlap the transistors 13A and 13B. The first electrodes 22 are formed of transparent conductive films such as ITO, and are electrically separated from each other for each pixel by the inter-pixel insulating films 15. The second electrode 23 is a reflective electrode, and is made of, for example, the same material as that of the first electrode 14 of the first embodiment. Color filters (a red filter 24R, a green filter 24G, and a blue filter 24B) are formed in a lower layer of the first electrode 22, and thus become on-chip color filters (OCCFs).

As mentioned above, in the laminate structure of the first floor F1 and the second floor F2, the circuit section 110B is disposed in a distribution manner in the first floor F1, and thus a bottom emission type display or a bottom emission type transparent display can be implemented. Also in the display device 2A, it is possible to realize a narrow frame or a non-frame.

Third Embodiment

Figure 19:
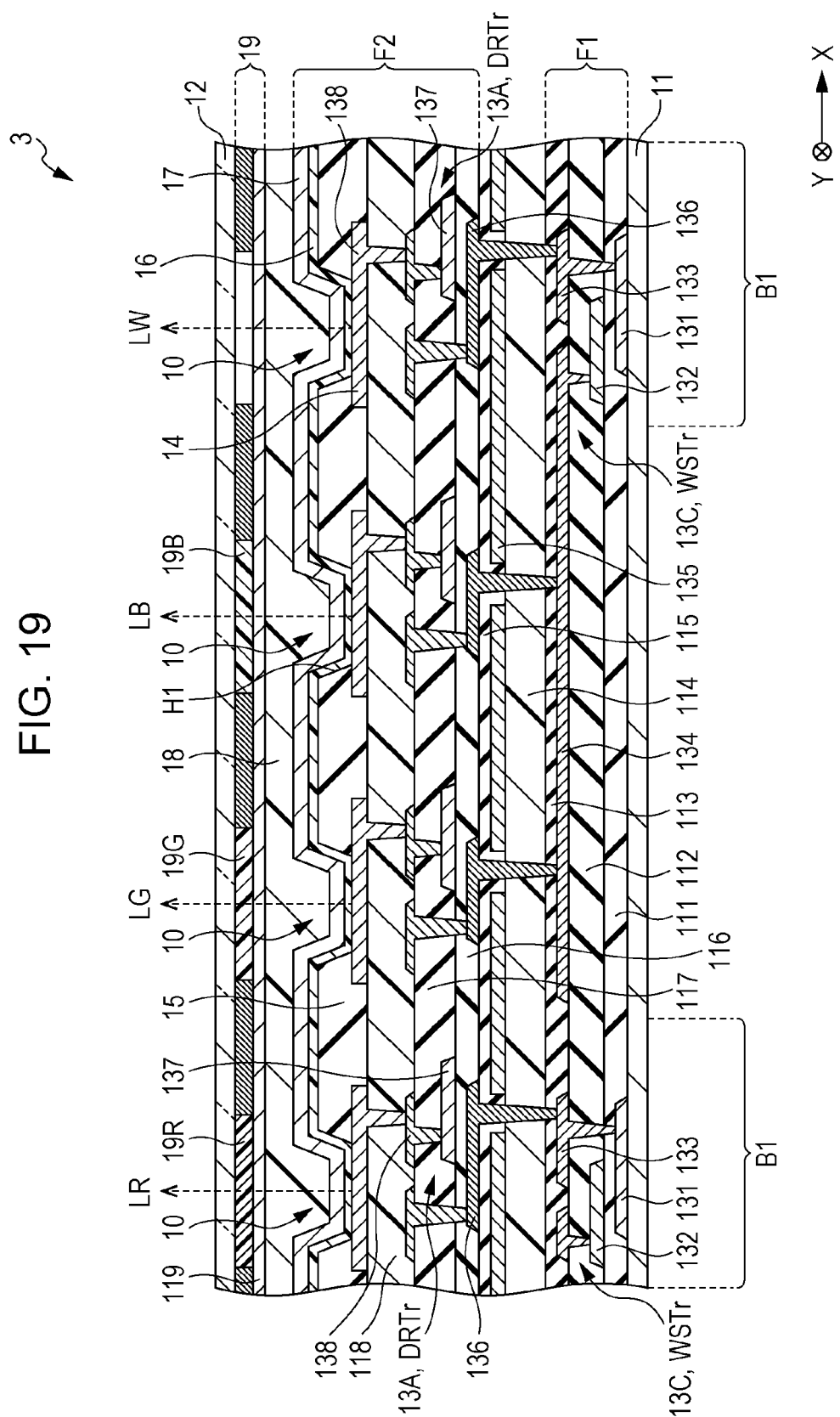
FIG. 19 is a cross-sectional view illustrating a configuration of a display device according to a third embodiment of the present disclosure.

FIG. 19 illustrates a cross-sectional configuration of a display device (display device 3) according to a third embodiment of the present disclosure. Also in the present embodiment, in the same manner as in the first embodiment, the first floor F1 including the circuit section 110B and the second floor F2 including the pixel section 110A are laminated. In addition, the circuit section 110B and the pixel section 110A overlap each other in the laminate portion B1. However, in the present embodiment, unlike in the first embodiment, some of the pixels PXLC are formed not in the second floor F2, but in the first floor F1. For example, a transistor 13C corresponding to the write transistor WSTr is formed in the first floor F1. The transistor 13A corresponding to the driving transistor DRTr is formed to overlap the transistor 13C in a plan view in the second floor F2. The transistor 13A is interfloor-connected to the transistor 13C via a planarization film 114.

Figure 20:
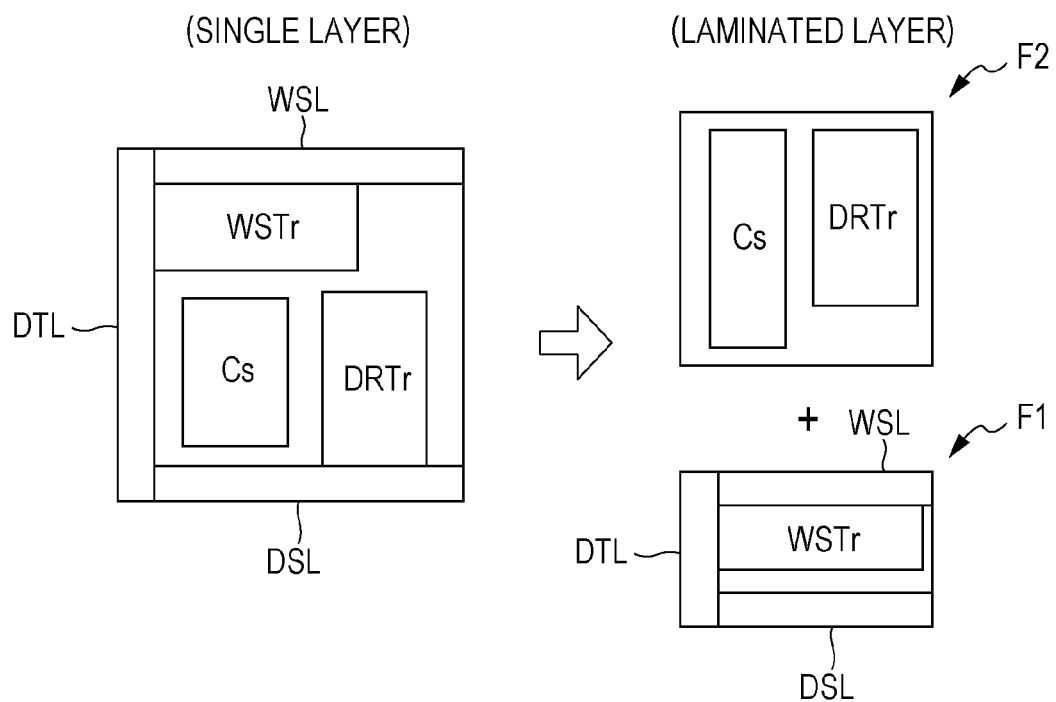
FIG. 20 is a schematic diagram for explaining configurations of a first floor and a second floor of the display device illustrated in FIG. 19.

FIG. 20 illustrates examples of layouts in cases where the constituent elements (the write transistor WSTr, the driving transistor DRTr, the capacitor Cs) of the pixel PXLC are arranged in a single layer (hereinafter, referred to as a "single layer arrangement") and are arranged separately in two floors (the first floor F1 and the second floor F2) (hereinafter, referred to as a "laminate arrangement"). In addition, the signal line DTL, the scanning line WSL, and the power supply line DSL are also illustrated. As mentioned above, in a case of the single layer arrangement, the write transistor WSTr, the driving transistor DRTr, and the capacitor Cs are disposed so as not to overlap each other. On the other hand, in a case of the laminate arrangement, for example, the write transistor WSTr, the signal line DTL, the scanning line WSL, and the power supply line DSL are disposed in the first floor F1, and the driving transistor DRTr and the capacitor Cs are disposed in the second floor F2. As mentioned above, an occupation area of the elements in each of the first floor F1 and the second floor F2 is smaller than that in the case of the single layer arrangement.

Figure 21:
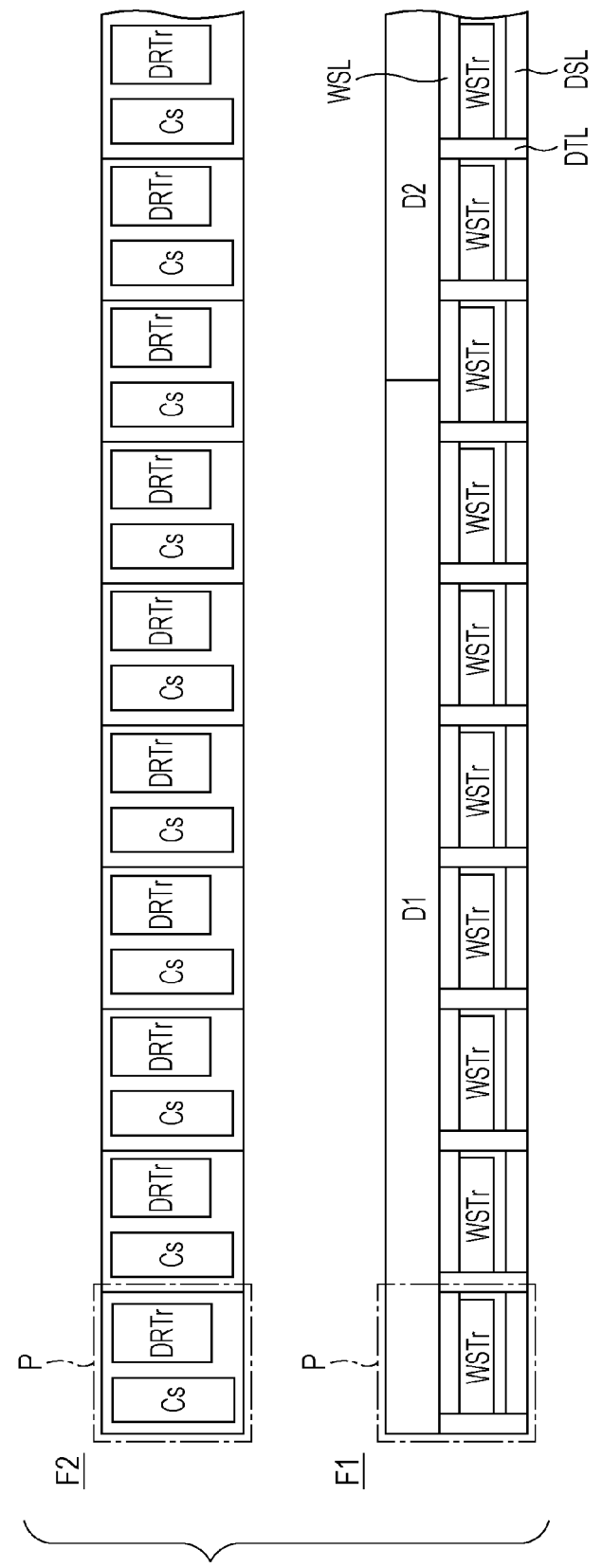
FIG. 21 is a schematic diagram illustrating configurations of the first floor and the second floor of the display device illustrated in FIG. 19.

FIG. 21 illustrates an example in which a layout is made in a combination of the above-described laminate arrangement and the distributed arrangement of the circuit elements. A region P is a region corresponding to a single pixel. As mentioned above, circuit elements D1, D2, . . . are disposed along with the write transistor WSTr, the signal line DTL, the scanning line WSL, and the power supply line DSL in the first floor F1. In other words, since a vacant space is generated through the distributed arrangement of the circuit elements in the first floor F1, the write transistor WSTr and the like are disposed by using the vacant space.

Figure 22:
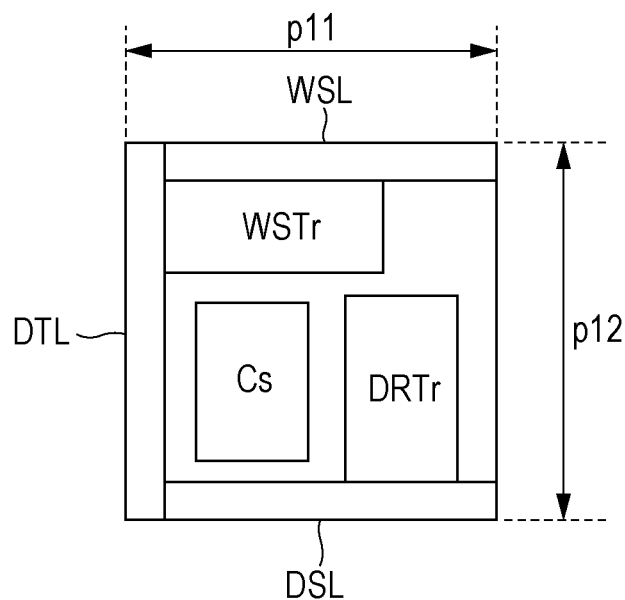
FIG. 22 is a schematic diagram for explaining an effect of the display device illustrated in FIG. 19.
Figure 23:
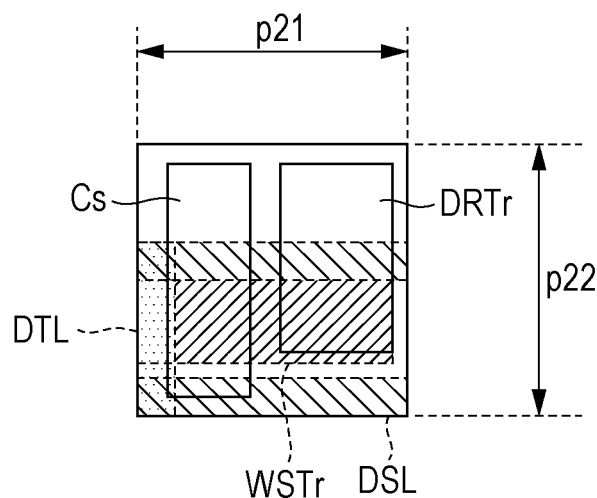
FIG. 23 is a schematic diagram for explaining an effect of the display device illustrated in FIG. 19.

In the present embodiment, in the same manner as in the first embodiment, the first floor F1 including the circuit section 110B and the second floor F2 including the pixel section 110A are laminated, and thus a space for disposing the circuit section 110B in the peripheral region of the pixel section 110A is reduced. Therefore, an effect equal to that of the above-described first embodiment can be achieved. In addition, since a part of the pixel section 110A is formed in the first floor F1, the same constituent elements as in a case of a single layer arrangement of FIG. 22 can be respectively formed in the first floor F1 (the write transistor WSTr, the signal line DTL, the scanning line WSL, and the power supply line DSL) and the second floor F2 (the driving transistor DRTr and the capacitor Cs) as illustrated in FIG. 23. In other words, the write transistor WSTr, the signal line DTL, the scanning line WSL, and the power supply line DSL, and the driving transistor DRTr and the capacitor Cs can be disposed so as to overlap each other in a plan view. For this reason, a pixel width p12 is smaller than a pixel width p11 in the case of the single layer arrangement, and thus high resolution can be realized.

In the above-described laminate arrangement, the transistor 13A (the driving transistor DRTr) and the transistor 13C (the write transistor WSTr) are formed in separate processes. For this reason, the performances of the transistor 13A and the transistor 13C can be controlled separately.

Figure 24A:
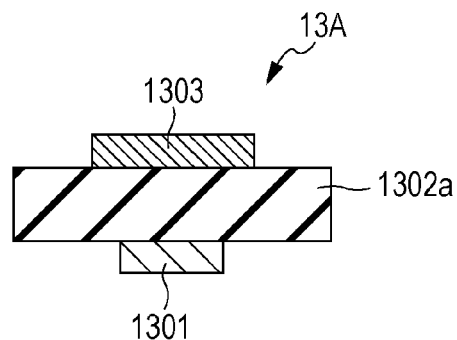
FIG. 24A is a schematic cross-sectional view for explaining merits of a transistor laminate structure.
Figure 24B:
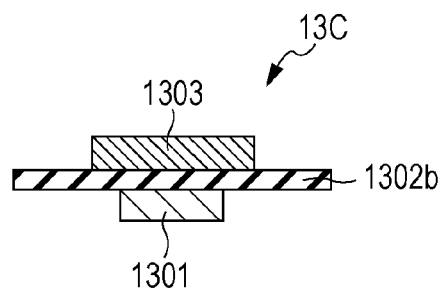
FIG. 24B is a schematic cross-sectional view for explaining merits of a transistor laminate structure.

For example, the transistor 13A (the driving transistor DRTr) of the second floor F2 does not have to have performance (for example, high mobility) higher than that of the transistor 13C (the write transistor WSTr) of the first floor F1. For this reason, for example, as illustrated in FIG. 24A, a thickness of a gate insulating film 1303a between a gate electrode 1301 and a channel layer 1303 is set to be relatively large in the transistor 13A. On the other hand, as illustrated in FIG. 24B, a thickness of a gate insulating film 1303b between the gate electrode 1301 and the channel layer 1303 is set to be relatively small in the transistor 13C. As mentioned above, the performances of the transistors 13A and 13C can be controlled separately.

Figure 24C:
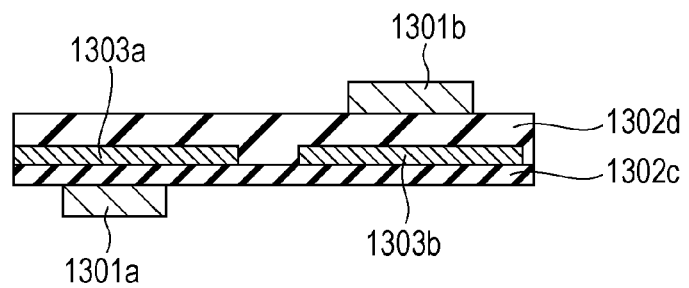
FIG. 24C is a schematic cross-sectional view for explaining merits of a transistor laminate structure.
Figure 24D:
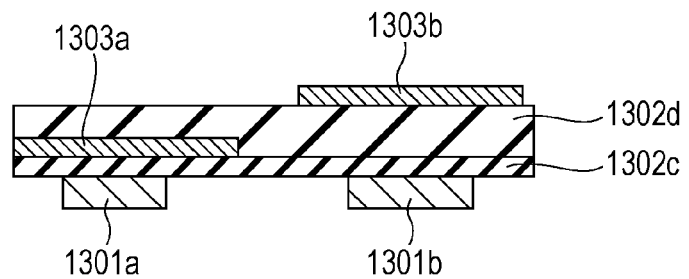
FIG. 24D is a schematic cross-sectional view for explaining merits of a transistor laminate structure.

In addition, a plurality of transistors including the transistor 13C may be formed in the first floor F1 through the same patterning step. For example, as illustrated in FIG. 24C, a transistor in which a gate electrode 1301a and a channel layer 1303a are disposed with a gate insulating film 1302c interposed therebetween, and a transistor in which a gate electrode 1301b and a channel layer 1303b are disposed with a gate insulating film 1302d interposed therebetween, may be formed. Alternatively, as illustrated in FIG. 24D, a transistor in which the gate electrode 1301a and the channel layer 1303a are disposed with the gate insulating film 1302c interposed therebetween, and a transistor in which the gate electrode 1301b and the channel layer 1303b are disposed with the gate insulating films 1302c and 1302d interposed therebetween, may be formed. As described above, the performances of the upper and lower transistors may be changed by changing constituent materials (LTPS, a TOS, amorphous silicon, microcrystalline silicon, HTPS, and the like). As mentioned above, through the laminate arrangement, transistors with various performances can be used in a combination thereof.

Modification Example 4

Figure 25:
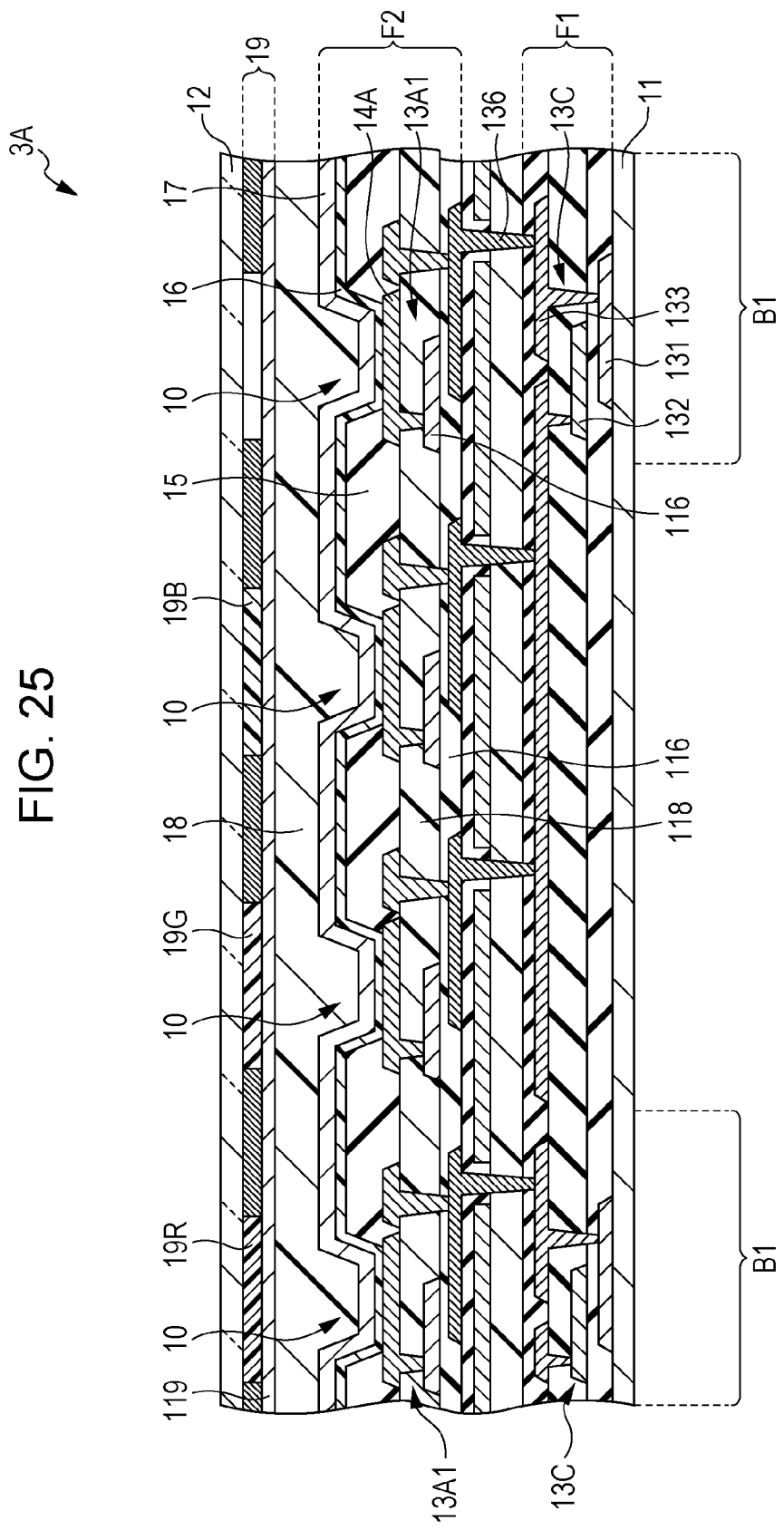
FIG. 25 is a cross-sectional view illustrating a configuration of a display device related to Modification Example 4.

FIG. 25 illustrates a cross-sectional configuration of a display device (display device 3A) related to a modification example (Modification Example 4) of the third embodiment. In the present modification example, in the pixel section 110A, a first electrode (first electrode 14A) of the organic EL element 10 is also used as a source/drain electrode of a transistor (transistor 13A1) corresponding to the driving transistor DRTr. In other words, a connection layer (corresponding to the source/drain electrode 138 illustrated in FIG. 4) between the first electrode 14A and the transistor 13A1 is omitted, and thus a layer structure simpler than in the first embodiment is formed. Specifically, in the present modification example, the interlayer insulating film 117 and the source/drain electrode 138 in the first embodiment are omitted so that the semiconductor layer 137 is directly connected to the first electrode 14A, and thus the number of process steps is reduced. The reason thereof will be described below.

Figure 26:
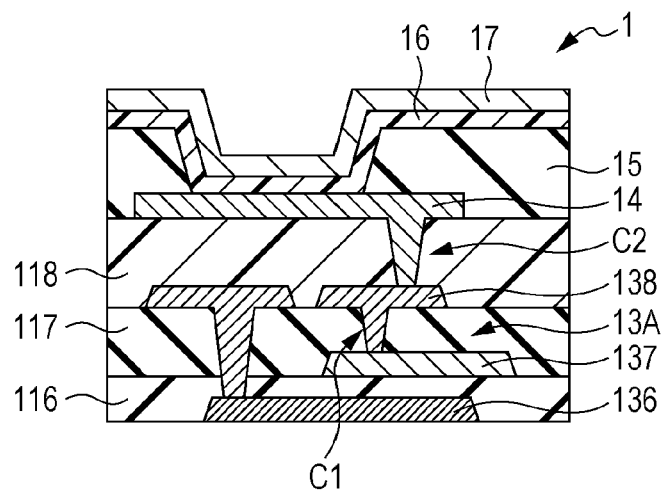
FIG. 26 is a cross-sectional view illustrating a configuration of main portions of a pixel section related to Comparative Example 2.
Figure 27:
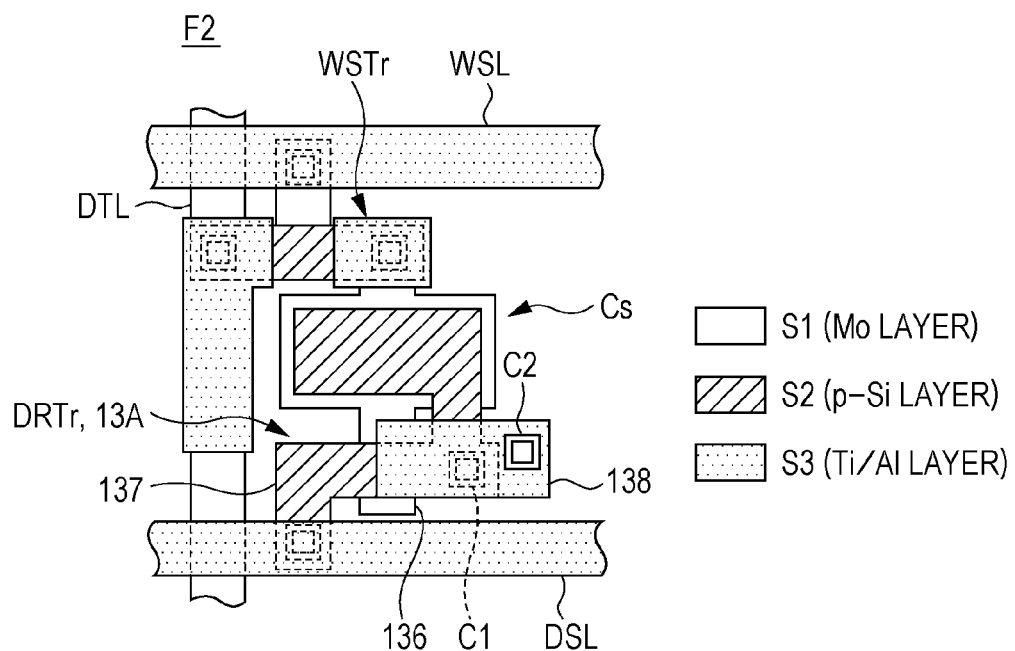
FIG. 27 is a schematic diagram illustrating an example of a planar layout of the pixel section illustrated in FIG. 26.

FIG. 26 illustrates a cross-sectional configuration of main portions of the display device 1 according to the first embodiment as a comparative example (Comparative Example 2) of the present modification example. FIG. 27 illustrates a planar layout of the main portion configuration of the display device 1. In a case where the constituent elements (the write transistor WSTr, the driving transistor DRTr, the capacitor Cs, and the like) of the pixel PXLC are formed in the second floor F2, the constituent elements are disposed in a layout as illustrated in FIG. 27, for example. In other words, a metal layer (Mo layer) S1 is patterned and formed in the same layer as the gate electrode 136, and a semiconductor layer (p-Si layer) S2 is patterned and formed in the same layer as the semiconductor layer 137. The metal layer S1 and the semiconductor layer S2 are interlayer-connected to a metal layer (Ti/Al layer) S3 which is patterned and formed in the same layer as that of the source/drain electrode 138, via a contact portion C1 or the like. A wiring layer such as the scanning line WSL or the power supply line DSL is also formed in the metal layer S3. For this reason, in Comparative Example 2, a space for forming the first electrode 14 is not sufficient in the same layer as the metal layer S3, and thus the first electrode 14 is formed in a layer different from the metal layer S3. Specifically, the first electrode 14 is formed via the planarization film 118, and thus the first electrode 14 is electrically connected to the source/drain electrode 138 via a contact portion C2.

Here, in the third embodiment, a description has been made of the "laminate arrangement" in which the write transistor WSTr (the transistor 13C) is formed in the first floor F1 and the driving transistor DRTr (the transistor 13A) is formed in the second floor F2, but a portion of the metal layer S3 of Comparative Example 2 used in the write transistor WSTr, the scanning line WSL, and the power supply line DSL are not necessary in the second floor F2 due to the laminate arrangement. In other words, in the display device 3A of the present modification example, only a portion (a portion which is also used as the first electrode 14A) of the metal layer S3 used in the driving transistor DRTr is disposed. For this reason, an area of the first electrode 14A can be secured so as to be wider than that in Comparative Example 2.

Figure 28:
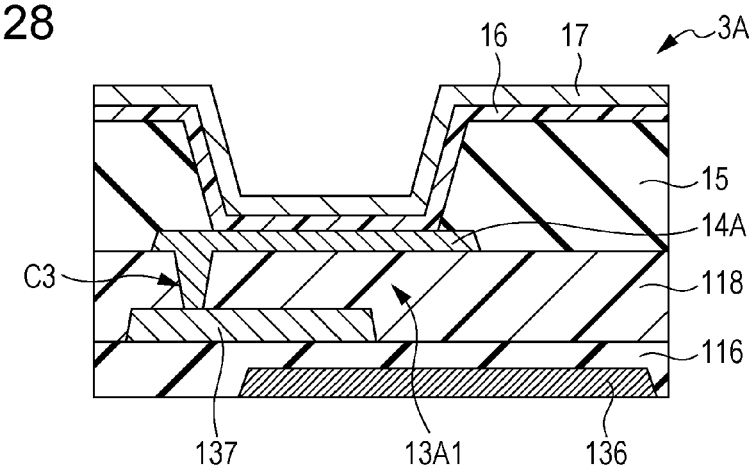
FIG. 28 is a cross-sectional view illustrating a configuration of main portions of the pixel section illustrated in FIG. 25.
Figure 29:
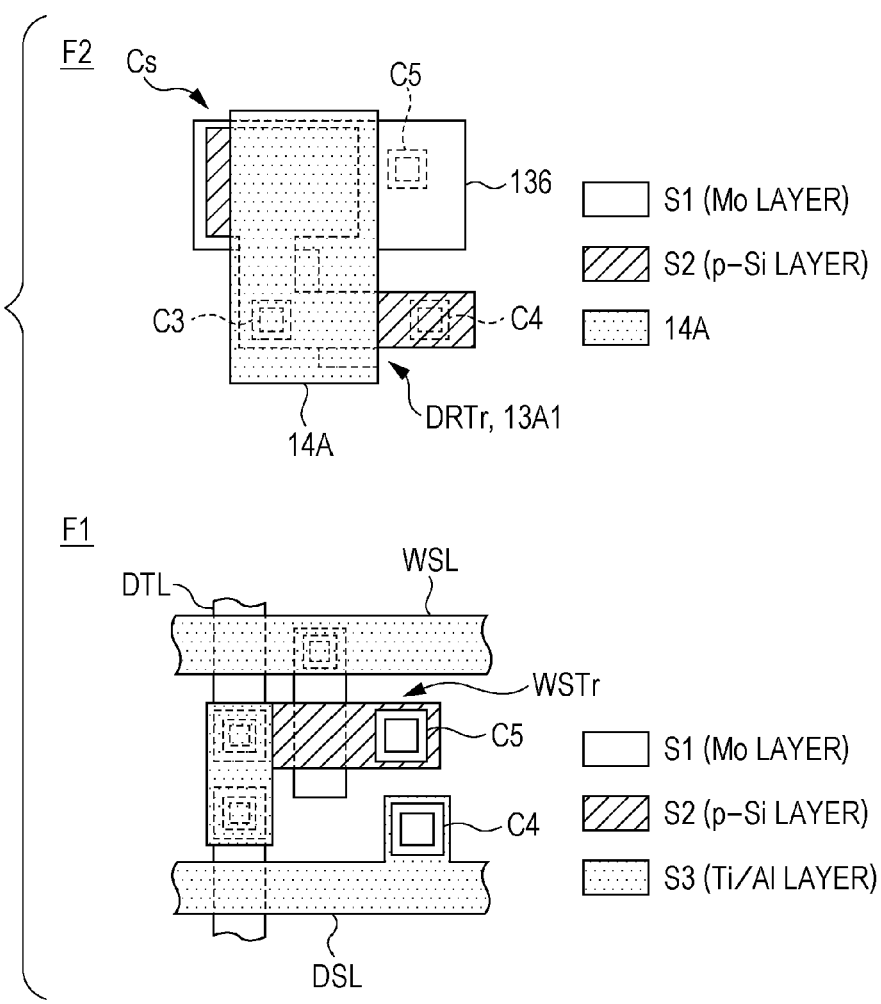
FIG. 29 is a schematic diagram illustrating an example of each planar layout of a first floor and a second floor of the pixel section illustrated in FIG. 25.

FIG. 28 illustrates a cross-sectional configuration of main portions of the display device 3A. FIG. 29 illustrates a planar layout of the main portion configuration of the display device 3A. In addition, an upper figure of FIG. 29 corresponds to a layout of the second floor F2, and a lower figure of FIG. 29 corresponds to a layout of the first floor F1. Also in the present modification example, in the same manner as in the third embodiment, the write transistor WSTr (the transistor 13C), the scanning line WSL, the signal line DTL, and the power supply line DSL are formed in the first floor F1. The driving transistor DRTr (the transistor 13A1) and the capacitor Cs are formed in the second floor F2.

In the first floor F1, for example, in a layout as illustrated in the lower figure of FIG. 29, a metal layer (Mo layer) S1 formed in the same layer as that of the gate electrode 131, a semiconductor layer (p-Si layer) S2 formed in the same layer as the semiconductor layer 132, and a metal layer (Ti/Al layer) S3 formed in the same layer as the electrode layer 133 are disposed so as to overlap each other in a plan view. In the second floor F2, for example, in a layout as illustrated in the upper figure of FIG. 29, a metal layer (Mo layer) S1 formed in the same layer as that of the gate electrode 136, a semiconductor layer (p-Si layer) S2 formed in the same layer as the semiconductor layer 137, and the first electrode 14A are disposed so as to overlap each other in a plan view.

In this laminate arrangement, the first floor F1 and the second floor F2 are interfloor-connected to each other via contact portions C4 and C5, and the like. In the second floor F2, the semiconductor layer 137 and the first electrode 14A are interlayer-connected to each other via a contact portion C3.

As described above, in the present modification example, a vacant space is generated in the second floor F2 due to the laminate arrangement, and thus the first electrode 14A can be formed in the same layer as the metal layer S3. Therefore, the interlayer insulating film 117 and the source/drain electrode 138 can be omitted so that the first electrode 14A can be formed, and thus a layer structure and process steps can be simplified.

Modification Example 5

Figure 30:
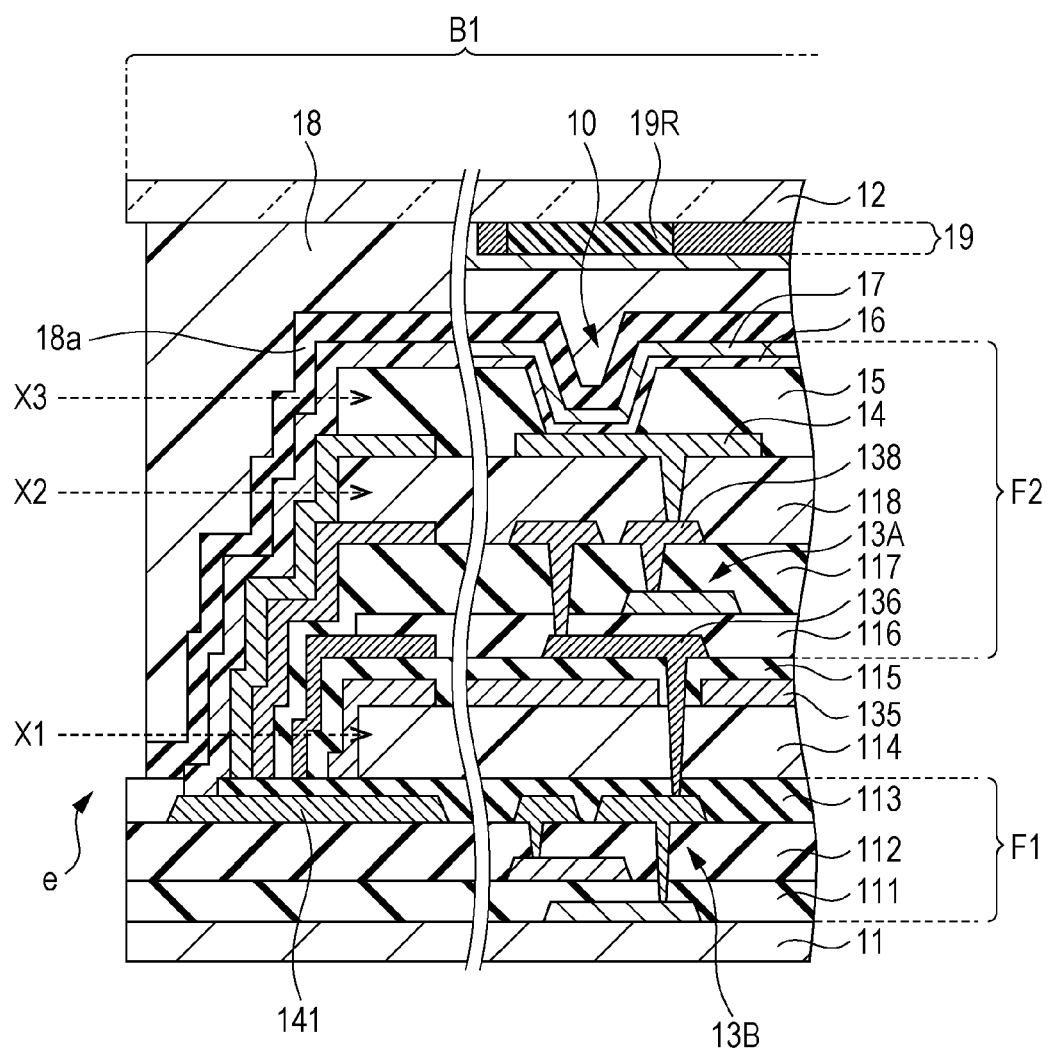
FIG. 30 is a cross-sectional view illustrating a configuration of a display device related to Modification Example 5.

FIG. 30 illustrates a cross-sectional configuration of the end surface vicinity of a display device related to a modification example (Modification Example 5) of the above-described embodiments and the like. The display device of the embodiments and the like has a laminate structure of the first floor F1 and the second floor F2, and the laminate structure is preferably covered with an inorganic insulating film or a metal film on an end surface e1 as in the present modification example. Specifically, the first floor F1, the planarization film 114, the shield layer 135, the interlayer insulating film 115, and the second floor F2 are formed in this order on the driving side substrate 11. The sealing substrate 12 is joined onto the second floor F2 via the resin layer 18 and the BM/CF layer 19.

In this laminate structure, particularly, the planarization film 114, and the planarization film 118 and the inter-pixel insulating film 15 in the second floor F2 are frequently made of an organic material. For this reason, there is a concern about water permeation via the planarization films 114 and 118 and the inter-pixel insulating film 15 (X1, X2, and X3). For this reason, another layer (an inorganic insulating film or a metal film) is preferably formed in an extension manner so as to cover the planarization films 114 and 118 and the inter-pixel insulating film 15 on the end surface e1 of the display device. Herein, the shield layer 135, the interlayer insulating film 115, the gate electrode 136 (the Mo layer S1), the interlayer insulating film 117, the source/drain electrode 138 (the Ti/Al layer S3), the first electrode 14, and the second electrode 17 are formed to extend to the end surface e1. In addition, the second electrode 17 is connected to a contact portion 141 (cathode contact) formed in the first floor F1 on the driving side substrate 11. A protective film 18a is formed to cover the entire display region and the end surface e1 between the second floor F2 and the resin layer 18. The protective film 18a is an inorganic film formed of, for example, a silicon oxide film or a silicon nitride film.

As in the present modification example, the layer formed of an inorganic insulating film or a metal film is formed to cover the layer formed of an organic film on the end surface e1, and thus a sealing performance of the display device is improved, and reliability is increased. In the above-described embodiments and the like, since the number of layers is increased due to the laminate structure of the first floor F1 and the second floor F2, the number of water permeation paths caused by the organic film is increased, and thus the sealing structure as in the present modification example is effective.

Application Examples

Hereinafter, application examples of the display device described in the above embodiments and the like will be described. The display device of the embodiments is applicable to display devices of electronic apparatuses of all fields, which display a video signal input from an external device or a video signal generated by an internal element as an image or a video, such as a television apparatus, a digital camera, a notebook type personal computer, a mobile terminal apparatus such as a mobile phone, a video camera, a smart phone, and a tablet type display. Particularly, the display device is suitable for a small or medium-sized display or a transparent display. Hereinafter, examples thereof will be described.

Figure 31A:
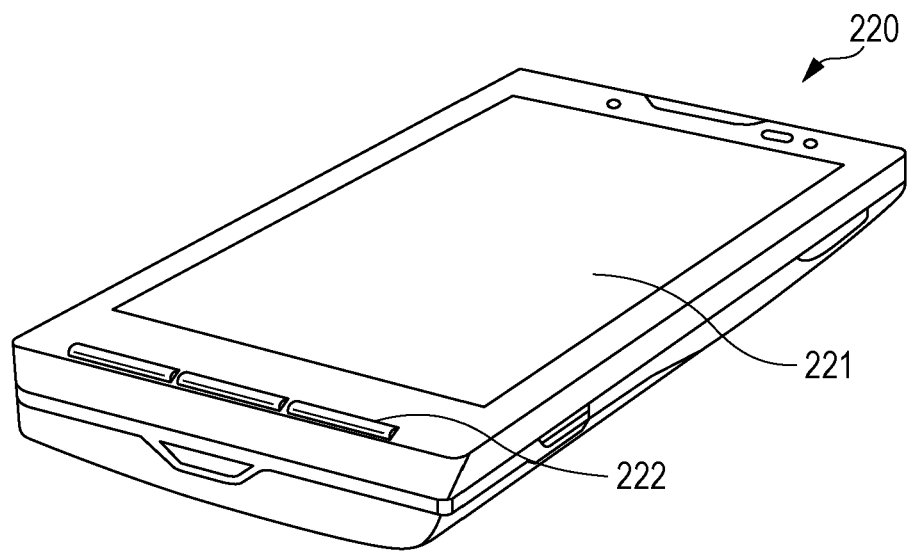
FIG. 31A is a perspective view illustrating an exterior of Application Example 1.
Figure 31B:
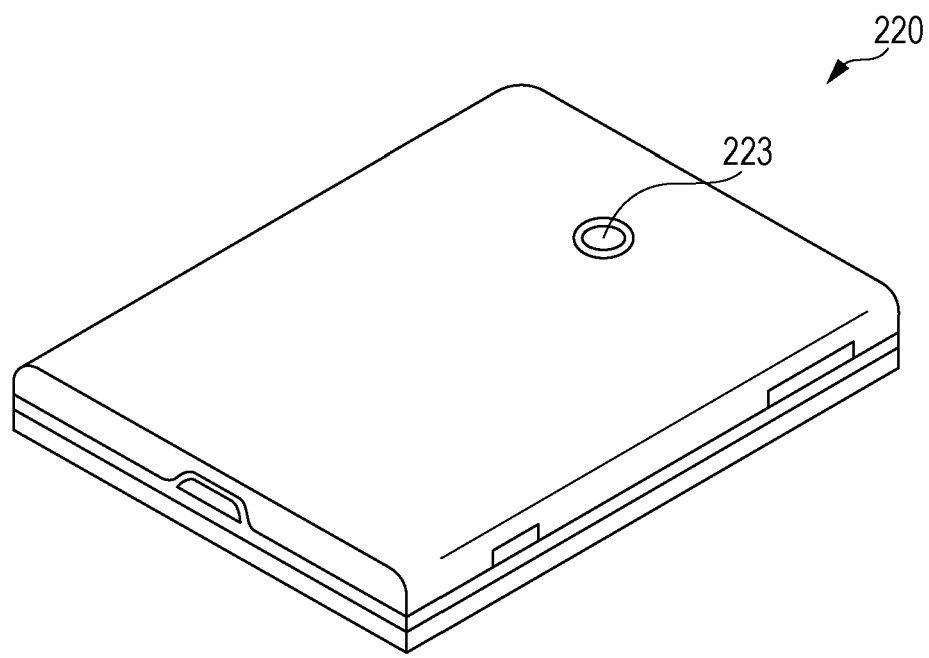
FIG. 31B is a perspective view illustrating an exterior of Application Example 1.

FIGS. 31A and 31B illustrate an exterior of a smart phone 220. The smart phone 220 has, for example, a display unit 221 and an operation unit 222 on a front side, and a camera 223 on a rear side, and the display device of the embodiments and the like is mounted in the display unit 221.

Figure 32A:
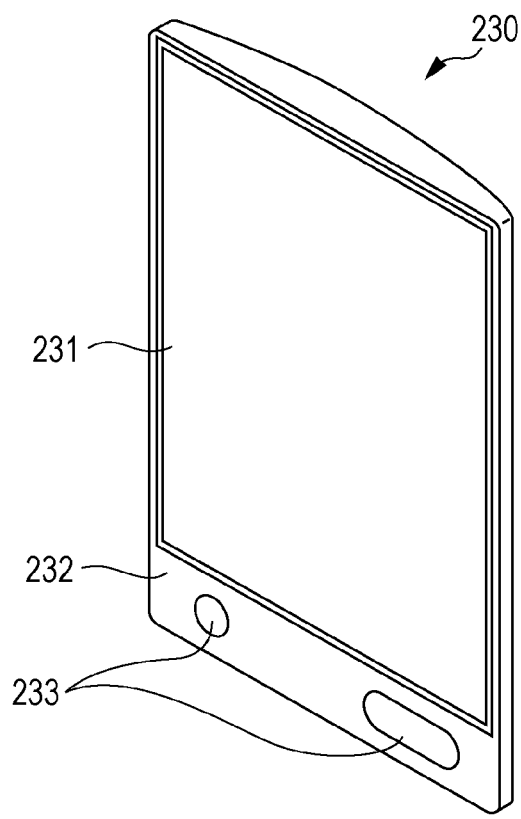
FIG. 32A is a perspective view illustrating an exterior of Application Example 2.
Figure 32B:
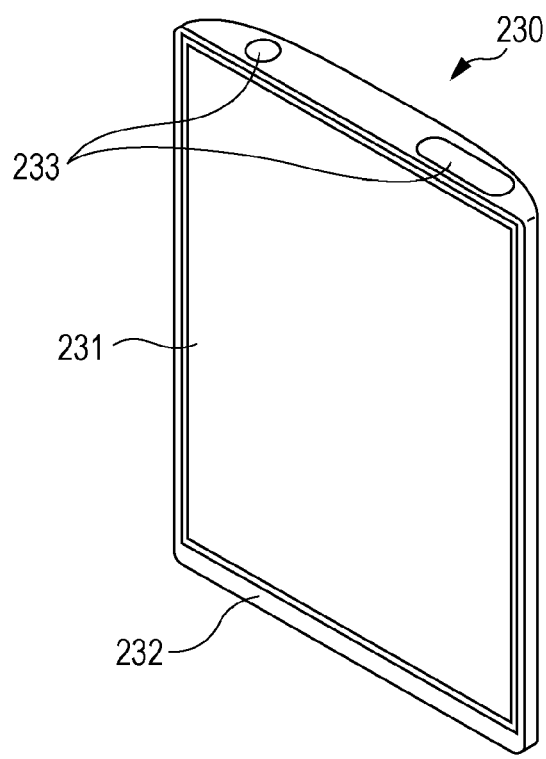
FIG. 32B is a perspective view illustrating an exterior of Application Example 2.

FIGS. 32A and 32B illustrate an exterior of a tablet type display 230. The tablet type display 230 has, for example, a touch panel unit 231, a casing 232, and an operation unit 233, and the display device of the embodiments and the like is mounted in the touch panel unit 231. The operation unit 233 may be provided in a frame portion of the touch panel unit 231 (FIG. 32A), and may be provided on a side surface of the casing 232 (FIG. 32B).

Figure 33B:
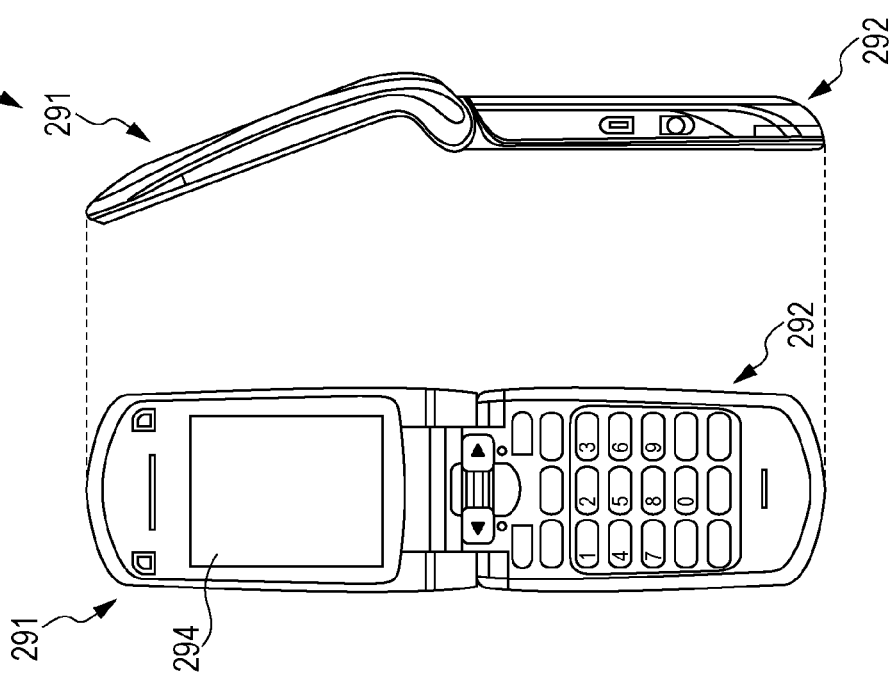
FIG. 33B is a perspective view illustrating an exterior of Application Example 3.
Figure 33A:
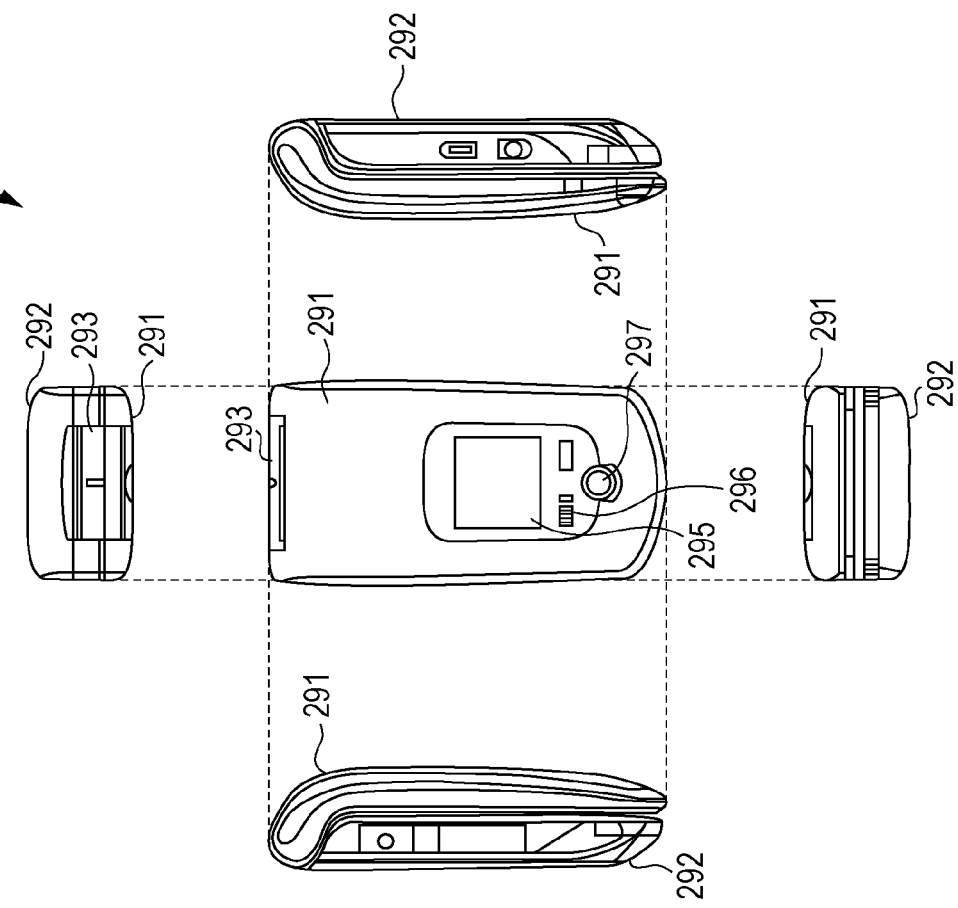
FIG. 33A is a perspective view illustrating an exterior of Application Example 3.

FIGS. 33A and 33B illustrate an exterior of a mobile phone 290. The mobile phone 290 is formed, for example, by connecting an upper casing 291 to a lower casing 292 via a connection portion (hinge portion) 293, and has a display 294, a sub-display 295, a picture light 296, and a camera 297. The display 294 or the sub-display 295 is constituted by the display device of the embodiments and the like.

Figure 34A:
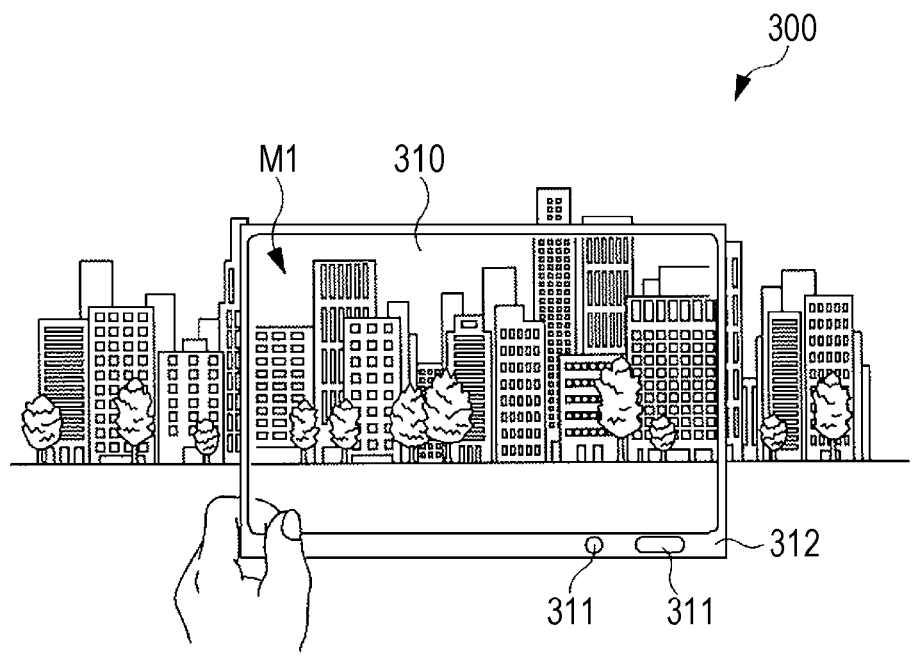
FIG. 34A is a view illustrating an exterior of Application Example 4.
Figure 34B:
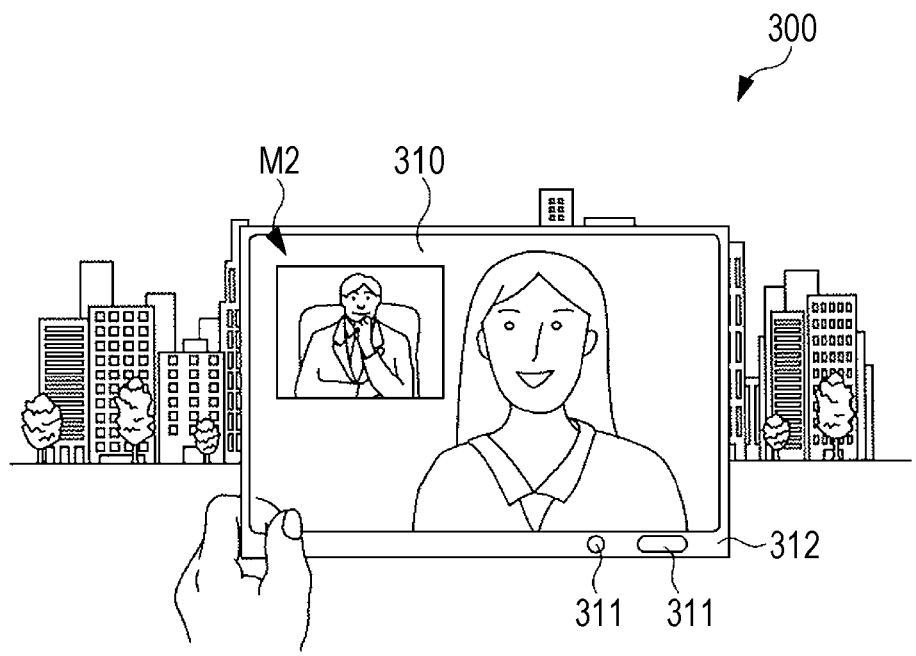
FIG. 34B is a view illustrating an exterior of Application Example 4.

FIGS. 34A and 34B illustrate an exterior of a tablet type transparent display 300. The tablet type transparent display 300 has, for example, a display unit 310, an operation unit 311, and a casing 312, and the display device of the embodiments and the like is mounted in the display unit 310.

The tablet type transparent display 300 can switch between a transparent display mode M1 (FIG. 34A) and a display mode M2 (FIG. 34B) by using, for example, an electrochromic element. The electrochromic element can be disposed by using a space other than the laminate portion B1 of the first floor F1 as described in the first embodiment. In the transparent display mode M1, an image or text information can be displayed while a background is viewed through the display unit 310.

Figure 35:
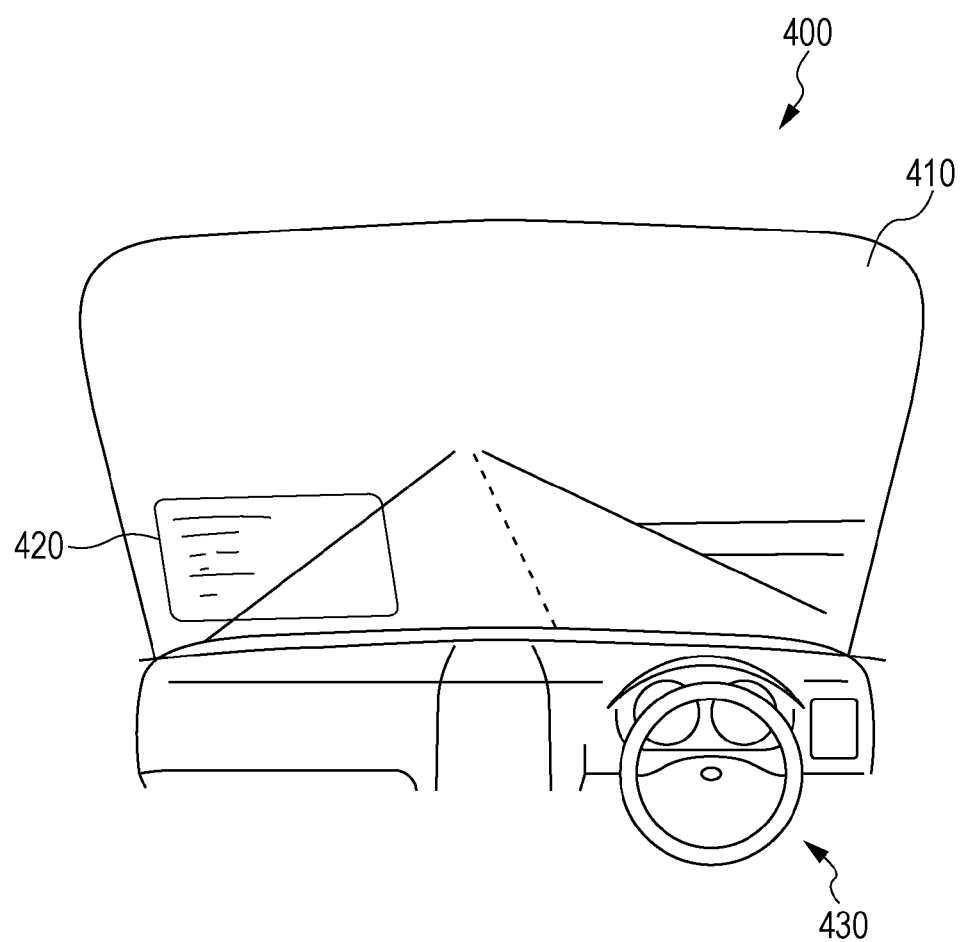
FIG. 35 is a view illustrating a portion of main portions of Application Example 5.

FIG. 35 illustrates an exterior of a head-up display 400. The head-up display 400 has a display unit 420 which is embedded in, for example, a front glass 410 of an automobile, and the display unit 420 corresponds to the display device of the embodiments and the like. The display unit 420 can display an image or text information while scenery over the glass is transmitted therethrough, and presents information, for example, without narrowing a field of view of a driver.

The display device of the embodiments and the like can realize a narrow frame, a non-frame, or a transparent display, and can thus be suitably used as an environment integrated type ambient display such as the tablet type transparent display 300 and the head-up display 400. In addition, since a narrow frame or a non-frame is realized, the display device is suitable for a so-called tiling type display in which a plurality of panels are spread and disposed.

As mentioned above, the present disclosure has been described by using the embodiments and the modification examples, but the present disclosure is not limited to the above-described embodiments and the like and may be variously modified. For example, in the embodiments and the like, cases where a single pixel is constituted by four sub-pixels of R, G, B, and W have been exemplified, but a pixel configuration of the present disclosure is not limited thereto. For example, a single pixel may be constituted by three sub-pixels of R, G, and B, or may be constituted by two sub-pixels. In addition, four sub-pixels of R, G, B, and yellow (Y) may be used.

In the embodiments and the like, an organic EL element has been exemplified as a display element of the pixel, but a display element of the present disclosure is not limited thereto and may be other display elements, for example, a liquid crystal display element or an electrophoretic element.

In addition, the embodiments and the like have exemplified an electrode structure in which white light emitted from the organic EL element can be split into colors by using the color filters, but the present disclosure is applicable to an element structure which does not use color filters.

The materials and the thicknesses or the formation methods and the formation conditions described in the embodiments and the like are not particularly limited, and other materials and thicknesses may be used, or other formation methods and formation conditions may be used.

In the embodiments, the active matrix type display device has been described, but the present disclosure is applicable to a passive matrix type display device.

In addition, a configuration of a pixel driving circuit for performing active matrix driving is not limited to one described in the embodiments, and a capacitive element or a transistor may be added as necessary. In this case, in addition to the above-described signal line driving circuit 120 or scanning line driving circuit 130, necessary driving circuits may be added depending on changes of the pixel driving circuit. The effects described in the embodiments and the like are only an example, and other effects may be achieved, and still other effects may be included therein.

The present disclosure may have the following configurations.

(1) A display device including a pixel section that includes a plurality of pixels each of which has a display element and which are disposed in a two-dimensional manner; and a driving circuit section that drives the plurality of pixels in order to perform display, in which a first floor including the driving circuit section and a second floor including the pixel section are laminated.

(2) The display device according to (1), in which the first floor and the second floor are formed in this order on a substrate.

(3) The display device according to (1) or (2), in which the driving circuit section includes a plurality of circuit elements, and in which the plurality of circuit elements are disposed in a distribution manner in the first floor.

(4) The display device according to any one of (1) to (3), in which the first floor and the second floor include light transmissive portions which communicate with each other in a laminate direction.

(5) The display device according to (4), in which the driving circuit section includes a plurality of circuit elements, in which the plurality of circuit elements are disposed in a distribution manner in the first floor, and in which the light transmissive portions are formed in gaps between the plurality of circuit elements.

(6) The display device according to any one of (1) to (5), in which the driving circuit section includes a plurality of circuit elements, and in which the plurality of circuit elements are provided in a selective first region of the first floor.

(7) The display device according to (6), in which a wiring layer is formed in another selective second region of the first floor.

(8) The display device according to (6) or (7), in which a functional element is formed in another selective second region of the first floor.

(9) The display device according to any one of (6) to (8), in which the pixel section has a rectangular shape in a plan view, and in which the first region is a region corresponding to at least one side of the rectangular shape.

(10) The display device according to any one of (1) to (9), in which a transistor formed in the pixel section and a transistor formed in the driving circuit section are formed to overlap each other in a plan view.

(11) The display device according to any one of (1) to (10), in which the pixel section includes a plurality of pixel transistors, and in which one of the plurality of pixel transistors is formed in the first floor.

(12) The display device according to (11), in which the pixel section includes a write transistor and a driving transistor as the pixel transistors, and in which the write transistor is formed in the first floor, and the driving transistor is formed in the second floor.

(13) The display device according to (12), in which an electrode of the display element is also used as a source/drain electrode of the driving transistor.

(14) The display device according to any one of (2) to (13), in which a transistor formed in the first floor contains low temperature polysilicon, and a transistor formed in the second floor contains an oxide semiconductor.

(15) The display device according to any one of (2) to (13), in which both a transistor formed in the first floor and a transistor formed in the second floor contain an oxide semiconductor.

(16) The display device according to any one of (2) to (13), in which both a transistor formed in the first floor and a transistor formed in the second floor contain low temperature polysilicon.

(17) The display device according to any one of (2) to (13), in which a transistor formed in the first floor contains an oxide semiconductor, and a transistor formed in the second floor contains low temperature polysilicon.

(18) The display device according to any one of (1) to (17), in which a shield layer is formed between the first floor and the second floor.

(19) The display device according to any one of (1) to (18), in which the display element is an organic electroluminescent element.

(20) An electronic apparatus including a display device that has a pixel section that includes a plurality of pixels each of which has a display element and which are disposed in a two-dimensional manner; and a driving circuit section that drives the plurality of pixels in order to perform display, in which a first floor including the driving circuit section and a second floor including the pixel section are laminated.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a second floor having a pixel section that includes at least one transistor, and a plurality of pixels that are disposed in a two-dimensional manner, each of the plurality of pixels having a display element; and
a first floor having a driving circuit section that drives the plurality of pixels in order to perform display,
wherein the first floor and the second floor are laminated.

2. The display device according to claim 1, wherein the first floor and the second floor are formed in this order on a substrate.

3. The display device according to claim 1, wherein the driving circuit section includes a plurality of circuit elements, and wherein the plurality of circuit elements are disposed in a distribution manner in the first floor.

4. The display device according to claim 1, wherein the first floor and the second floor include light transmissive portions which communicate with each other in a laminate direction.

5. The display device according to claim 4, wherein the driving circuit section includes a plurality of circuit elements,
wherein the plurality of circuit elements are disposed in a distribution manner in the first floor, and
wherein the light transmissive portions are formed in gaps between the plurality of circuit elements.

6. The display device according to claim 1, wherein the driving circuit section includes a plurality of circuit elements, and wherein the plurality of circuit elements are provided in a selective first region of the first floor.

7. The display device according to claim 6, wherein a wiring layer is formed in another selective second region of the first floor.

8. The display device according to claim 6, wherein a functional element is formed in another selective second region of the first floor.

9. The display device according to claim 6, wherein the pixel section has a rectangular shape in a plan view, and wherein the selective first region of the first floor is a region corresponding to at least one side of the rectangular shape.

10. The display device according to claim 1, wherein the driving circuit section further includes a second transistor, and wherein the at least one transistor of the pixel section and the second transistor of the driving circuit section are formed to overlap each other in a plan view.

11. The display device according to claim 1, wherein the pixel section includes a plurality of pixel transistors, and wherein one of the plurality of pixel transistors is formed in the first floor.

12. The display device according to claim 11, wherein the pixel section includes a write transistor and a driving transistor as the pixel transistors, and wherein the write transistor is formed in the first floor, and the driving transistor is formed in the second floor.

13. The display device according to claim 12, wherein an electrode of the display element is also used as a source/drain electrode of the driving transistor.

14. The display device according to claim 2, wherein the first floor further includes a second transistor that contains low temperature polysilicon, and wherein the at least one transistor contains an oxide semiconductor.

15. The display device according to claim 2, wherein the first floor further includes a second transistor, and wherein the at least one transistor and the second transistor contain an oxide semiconductor.

16. The display device according to claim 2, wherein the first floor further includes a second transistor, and wherein the at least one transistor and the second transistor contain low temperature polysilicon.

17. The display device according to claim 2, wherein the first floor further includes a second transistor that contains an oxide semiconductor, and wherein the at least one transistor contains low temperature polysilicon.

18. The display device according to claim 1, wherein a shield layer is formed between the first floor and the second floor.

19. The display device according to claim 1, wherein the display element is an organic electroluminescent element.

20. An electronic apparatus comprising:
a display device including
a second floor having a pixel section, the pixel section including at least one transistor, and a plurality of pixels that are disposed in a two-dimensional manner, each of the plurality of pixels having a display element; and
a first floor having a driving circuit section that drives the plurality of pixels in order to perform display,
wherein the first floor and the second are laminated.

* * * * *